(12) United States Patent
Thijs et al.

(10) Patent No.: US 7,649,722 B2
(45) Date of Patent: Jan. 19, 2010

(54) ELECTROSTATIC DISCHARGE PROTECTED CIRCUITS

(75) Inventors: Steven Thijs, Willebroek (BE);
Natarajan Mahadeva Iyer, Kottayam (IN); Dimitri Linten, Boortmeerbeek (BE)

(73) Assignee: Interuniversitair Microelektronica Centrum (IMEC), Leuven (BE)

( * ) Notice: Subject to any disclaimer, the term of this patent is extended or adjusted under 35 U.S.C. 154(b) by 181 days.

(21) Appl. No.: 11/521,293

(22) Filed: Sep. 14, 2006

(65) Prior Publication Data

US 2007/0058308 A1    Mar. 15, 2007

Related U.S. Application Data

(60) Provisional application No. 60/716,871, filed on Sep. 14, 2005.

(51) Int. Cl.
*H02H 9/00* (2006.01)
*H02H 3/08* (2006.01)

(52) U.S. Cl. ........................................ 361/56; 361/93.5

(58) Field of Classification Search .................... 361/56, 361/93.5
See application file for complete search history.

(56) References Cited

U.S. PATENT DOCUMENTS

| | | | |
|---|---|---|---|
| 5,969,929 A | 10/1999 | Kleveland et al. | 361/111 |
| 6,433,985 B1 | 8/2002 | Voldman et al. | 361/113 |
| 6,493,850 B2 * | 12/2002 | Venugopal et al. | 716/4 |
| 6,933,573 B2 * | 8/2005 | Ker et al. | 257/355 |
| 7,224,949 B2 * | 5/2007 | Kluge et al. | 455/217 |

OTHER PUBLICATIONS

Jeamsaksiri et al., "Integration of a 90nm RF CMOS Technology (200GHz $f_{max}$—150GH$_z$ $f_T$ NMOS) Demonstrated on a 5GHz LNA," 2004 Symposium on VLSI Technology Digest of Technical Papers, pp. 100-101, 2004 IEEE.

Linten et al., "Design-driven Optimisation of a 90 nm RF CMOS Process by Use of Elevated Source/Drain," pp. 43-46, 2003 IEEE.

Linten et al., "Low-power 5 GHz LNA and VCO in 90 nm RF CMOS," 2004 Symposium on VLSI Circuits Digest of Technical Papers, pp. 372-375, 2004 IEEE.

(Continued)

*Primary Examiner*—Fritz M. Fleming
*Assistant Examiner*—Lucy Thomas
(74) *Attorney, Agent, or Firm*—McDonnell Boehnen Hulbert & Berghoff LLP

(57) ABSTRACT

A method for designing an ESD protected analog circuit is described. The method includes creating an analog circuit design comprising a plurality of interconnected functional components and circuit-level ESD protection components with predetermined electric properties for achieving a predetermined analog performance during normal operation of the circuit as well as a predetermined ESD robustness during an ESD event on the circuit. At least one ESD event is simulated on the analog circuit design to identify at least one weak spot in the circuit. Component-level ESD protection components are added into the analog circuit design around each identified weak spot to reduce failure of the weak spot during an ESD event.

28 Claims, 15 Drawing Sheets

OTHER PUBLICATIONS

Shaeffer et al., "A 1.5-V, 1.5-GHz CMOS Low Noise Amplifier," IEEE Journal of Solid-State Circuits, vol. 32, No. 5, May 1997.

Ker et al., "ESD Protection Design for Giga-Hz RF CMOS LNA with Novel Impedance-Isolation Technique," 2003 EOS/ESD Symposium, 2003 ESD Association.

Leroux et al., "High-performance 5.2GHz LNA with On-Chip Inductor to Provide ESD Protection," Electronics Letters, pp. 467-469, Mar. 29, 2001, vol. 37, No. 7.

O'Connor et al., "Weibull Slope and Voltage Acceleration of Ultra-Thin (1.1-1.45 nm EOT) Oxynitrides,"Microelectronic Engineering 72 (2004) 61-65.

Hyvonen et al., "Comprehensive ESD Protection for RF Inputs," 2003 EOS/ESD Symposium, 2003 ESD Association.

Vassilev et al., "Advanced Modelling and Parameter Extraction of the MOSFET ESD Breakdown Triggering in the 90nm CMOS Node Technologies," 2004 EOS/ESD Symposium, 2004 ESD Association.

* cited by examiner

ELECTROSTATIC DISCHARGE PROTECTED CIRCUITS

RELATED APPLICATIONS

The present patent application claims priority under 35 U.S.C. §119(e) to U.S. Provisional Patent Application Serial No. 60/716,871, which was filed Sep. 14, 2005. The full disclosure of U.S. Provisional Patent Application Serial No. 60/716,817 is incorporated herein by reference.

FIELD

The invention generally relates to electrostatic discharge (ESD) protected circuits, in particular analog circuits, such as RF circuitry and methods for designing such circuits.

BACKGROUND

For a long time, people have attempted to combine ESD performance and analog performance in a single circuit. However, it is not a straightforward task to match the ESD robustness with the analog performance, in particular RF performance. ESD elements are known to be inter alia large and frequency-dependent, which conflicts with the meticulous selection of the analog elements.

Roughly speaking, one can distinguish two design approaches when adding ESD functionality to an analog circuit: co-design and plug&play design. As the name indicates, in the plug&play design approach one inserts the designed ESD element, given the required ESD performance, as a whole in the analog circuit. The ESD element is then a compact element that is inserted where needed, typically as close as possible to the input/output pads. When ESD and analog performance is to be combined, it is important how the ESD parameters are selected. In the plug&play approach, one first optimizes the analog performance, and then determines the ESD elements and their layout with the aim to minimize the impact of ESD performance on analog performance. In this independent or successive design approach, ESD elements and analog elements are to a large extent independently developed, be it that the selection of ESD elements is subject to the analog performance. This is the most classical approach and is most often applied in digital design.

In the co-design or simultaneous approach, ESD elements are determined in view of their analog performance and analog elements are selected in view of their ESD performance. Hence, by determining the parameters of a circuit element, both the ESD and analog characteristics of this circuit element are taken into account. However, by taking the ESD protection into the analog design space, additional challenges are introduced to the freedom of the analog designer who previously only was concerned and knowledgeable about analog performance. When ESD and analog performance are to be matched, it is important how the ESD and RF parameters are selected.

Whether or not the ESD elements are selected with minimal impact on the analog parameters, i.e., the plug&play approach, or as part of the analog design, i.e., the co-design approach, one can still select how the ESD elements are inserted in the analog circuit. In the distributed approach, instead of inserting the compact ESD element at a single location in the analog circuit, one will distribute the ESD element over the whole of the analog circuit. In the distributed design, the ESD element is split or "distributed" over the analog circuit. An example of such distributed design is given by U.S. Pat. No. 5,969,929, where the ESD elements are distributed over the transmission line. The effective impedance of the distributed ESD elements and of the transmission line protected by the ESD elements is defined to match the impedance of external elements.

As a further example, U.S. Pat. No. 6,433,985 discloses an ESD protection network that prevents high voltage oxide stress. Due to device scaling, the dielectrics used in semiconductor processing become thinner and the effective electrical fields applied over these dielectrics will increase. In order to protect, for example, the gate dielectric of a transistor, from ESD events, such as overvoltage, at frequencies below the operational frequency of the circuit, a capacitor is inserted in the ESD network. This capacitor is designed to propagate signals at operational frequency, but to block or at least delay signals with a lower the operational frequency. The first ESD elements are designed to discharge the ESD current, while the second ESD elements will see a reduced signal due to the blocking capacitor. These second ESD elements can be made physically smaller, for example, by a factor of approximately three. The voltage level experienced by the gate dielectric during an ESD event is reduced by placing a blocking capacitor between the gate dielectric and the possible source of ESD event. All signals having a frequency equal to or higher then the operational frequency can pass. This design can be considered as a plug&play—independent design: the ESD element is added as whole to the input of the receiver, while the capacitance value is selected to have operational signals pass.

SUMMARY

A method for designing an ESD protected analog circuit is described. The method includes creating an analog circuit design comprising a plurality of interconnected functional components and circuit-level ESD protection components with predetermined electric properties for achieving a predetermined analog performance during normal operation of the circuit as well as a predetermined ESD robustness during an ESD event on the circuit.

As used herein, with "circuit-level ESD protection" is meant that the ESD protection is regarded on the circuit as a whole, as opposed to "component-level ESD protection" which is used further on and is intended to mean that the ESD protection is regarded on a single component.

Additionally, at least one ESD event is simulated on the analog circuit design to identify at least one weak spot in the circuit. Component-level ESD protection components are added onto the analog circuit design around each previously identified weak spot to further prevent failure of the weak spot during an ESD event.

In the simulation, it is determined which electrical signals, i.e., voltages/currents, are present on every component during an ESD event. Failure of the overall circuit, even in the presence of the "circuit-level" ESD protection components, can then be attributed to one or more specific functional elements or parts thereof, e.g. a transistor: in particular the gate oxide or the source/drain junction, a bipolar transistor: in particular the emitter/base junction, etc. These functional elements or parts thereof form the so-called weak spots which are identified by means of the simulation. Following the identification of a weak spot, local "component-level" ESD protection components are added around it to protect this functional element from failure during the ESD event that would, in absence of the additional ESD protection, cause its failure.

These steps of simulating an ESD event and adding component-level ESD protection are preferably re-iterated a few times to enhance ESD robustness for a number of weak spots. In this way, one can check once again the overall circuit to see which other functional component is the next to fail and might need additional local protection.

Preferably, the component-level ESD protection components are chosen of such a small size that their addition to the analog circuit design has substantially no influence on the analog performance during normal operation. In this way, ESD robustness can be enhanced without deteriorating analog performance. Furthermore, due to the small size of the added components, no additional space has to be reserved in the circuit design for the additional ESD protection and the layout of the original circuit design can be maintained.

Preferably, the method further comprises evaluating the electric properties of the circuit-level ESD protection components and, if necessary, adapting them to reduce their impact on the analog performance during normal operation. As the ESD failure is shifted due to the local component-level ESD protection components, possibly the settings for the circuit-level ESD protection components can be changed as the overall ESD performance has improved.

The component-level ESD protection components may comprise a protective diode network, which is added to protect the functional element at the identified weak spot from an ESD event causing the failure thereof in absence of the protective diode network.

The diode network preferably comprises diodes of "contact size", which as used herein means that the diodes are minimum sized, i.e., as small as possible in the semiconductor technology in which the circuit is processed, for example, in 90 nm technology the minimum size is $0.15\ \mu m^2$. The diode network can be any configuration of diodes: series, parallel, parallel or opposite directions. The exact configuration will depend on which element is to be protected against which ESD event. For example, if a functional component is protected against a Vdd overvoltage, the corresponding protective diode configuration might be different from the diode configuration protecting the same functional component from an input overvoltage.

In one embodiment, the circuit-level ESD protection components are plug&play ESD protection components. In this case, creating the analog circuit design comprises the following. First, the analog circuit design is created comprising the plurality of interconnected functional components, whose electric properties are determined for achieving the predetermined analog performance during normal operation of the circuit. Next, plug&play ESD protection components are added onto the analog circuit design. The electric properties of these plug&play components are chosen for achieving the predetermined ESD robustness during an ESD event on the circuit. So in this embodiment, analog performance and ESD robustness are considered in successive, independent steps. The plug&play ESD protection components can be both situated more towards the input and output of the circuit or distributed over the circuit.

In an alternative embodiment of the method of the invention, the creating the analog circuit design is a simultaneous approach in which the circuit-level ESD protection components are co-designed with the functional components. In this alternative embodiment as well, the co-designed ESD protection components can be both situated more towards the input and output of the circuit or distributed over the circuit.

An analog circuit is also described. The analog circuit may include a plurality of interconnected functional components with predetermined electric properties for achieving a predetermined analog performance during normal operation of the circuit. The circuit may further include a plurality of circuit-level ESD protection components connected to the functional components with predetermined electric properties for achieving a predetermined ESD robustness during an ESD event on the circuit. Additional ESD protection is provided by at least one component-level ESD protection component, connected to at least one of the functional components that have been identified as a weak spot in the circuit, for avoiding failure of the weak spot during an ESD event.

Preferably, the at least one component-level ESD protection component comprises a protective diode network, which is adapted for protecting the functional element identified as weak spot from the specific ESD event causing the failure thereof in absence of the protective diode network. The diode network preferably comprises diodes of contact size. The diode network can be any configuration of diodes: series, parallel, parallel or opposite directions. The exact configuration will depend on which element is to be protected against which ESD event.

In one embodiment, the analog circuit is a low noise amplifier circuit for RF signals. This amplifier circuit comprises as one of its functional components a first transistor having a source, a drain, a gate, and a gate oxide separating the gate from the source and the drain. The amplifier circuit further comprises first component-level ESD protection components connecting the gate to the drain and second component-level ESD protection components connecting the gate to ground. The first and second ESD protection components are provided for avoiding breakdown of the gate oxide during an ESD event.

The first and second ESD protection components preferably comprise voltage clamping devices for clamping the voltage over the gate oxide during an ESD event at a predetermined maximum below the breakdown voltage of the oxide. The first ESD protection components preferably comprise an array of diodes arranged in series, preferably of contact size. The second ESD protection components preferably comprise an array of diodes arranged in parallel and in opposite directions, preferably of contact size.

The low noise amplifier may also include third and fourth ESD protection components, which form low-impedance paths towards the ground at frequencies below that of the RF signals for which the low noise amplifier is designed. These third and fourth ESD protection components are circuit-level components. They preferably comprise inductors at the input and the output of the circuit.

In another embodiment, the circuit is a distributed amplifier comprising a plurality of parallel gain stages, each comprising at least one transistor as one of the functional components of the circuit. Each transistor has a source, a drain, a gate, and a gate oxide separating the gate from the source and the drain. The distributed amplifier further comprises a network of the circuit-level ESD protection components distributed over the gain stages for shunting ESD currents upon occurrence of ESD events to ground. Further ESD protection is provided by first and second component-level ESD protection components associated with each of the gain stages. The first component-level ESD protection components connect the gate to the drain and the second component-level ESD protection components connect the gate to ground. The first and second ESD protection components are provided for avoiding breakdown of the gate oxide during an ESD event.

The first and second ESD protection components preferably comprise voltage clamping devices for clamping the voltage over the gate oxide during an ESD event at a predetermined maximum below the breakdown voltage of the oxide. The first ESD protection components preferably comprise an array of diodes arranged in series, preferably of contact size. The second ESD protection components preferably comprise an array of diodes arranged in parallel and in opposite directions, preferably of contact size.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
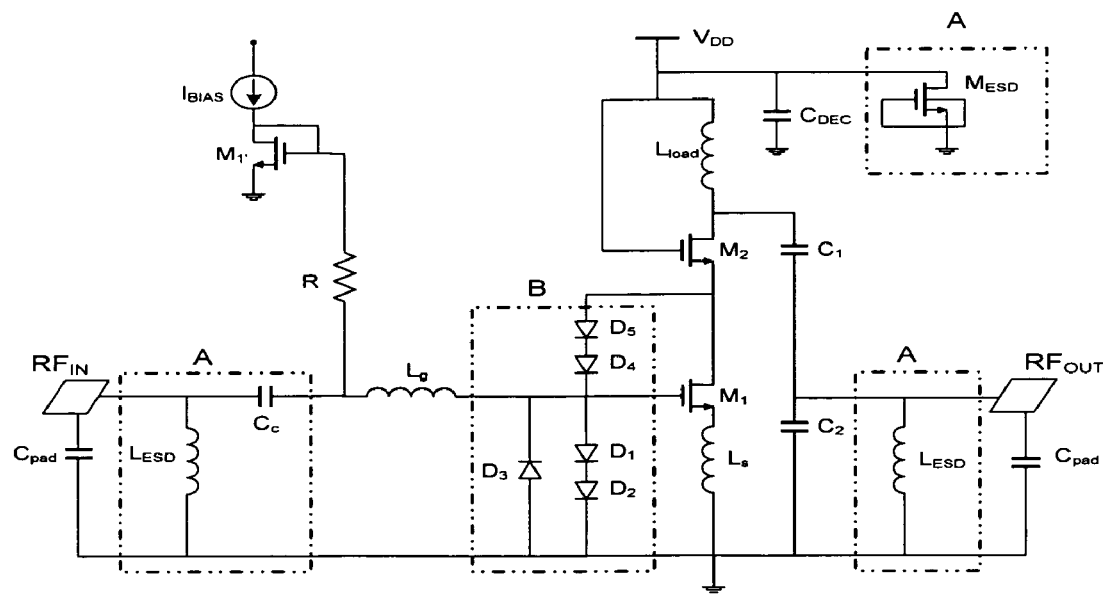
FIG. 1 shows an example of an ESD-protected analog circuit, in particular, a low noise amplifier (LNA).

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Figure 28:
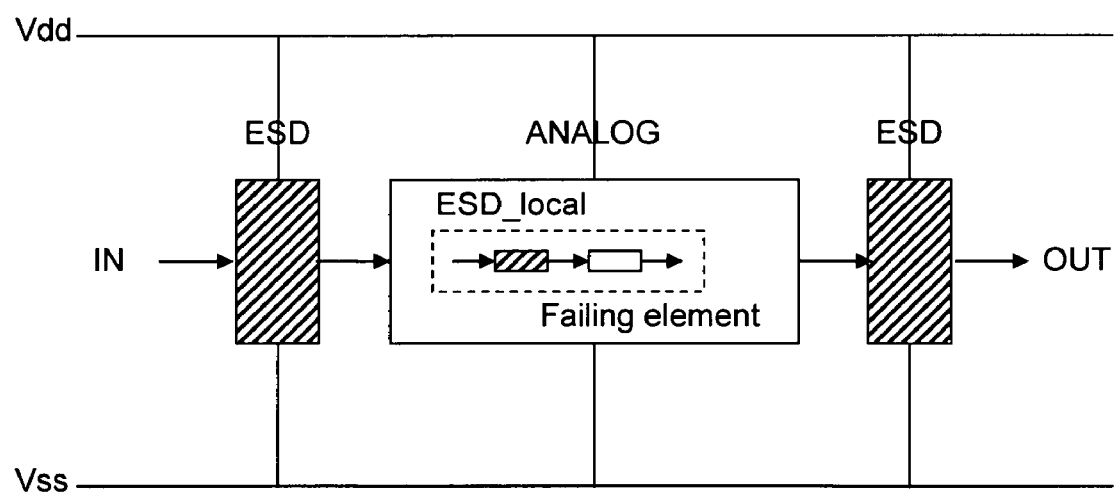
FIG. 28 shows an example of an analog circuit, according to the invention.
Figure 29:
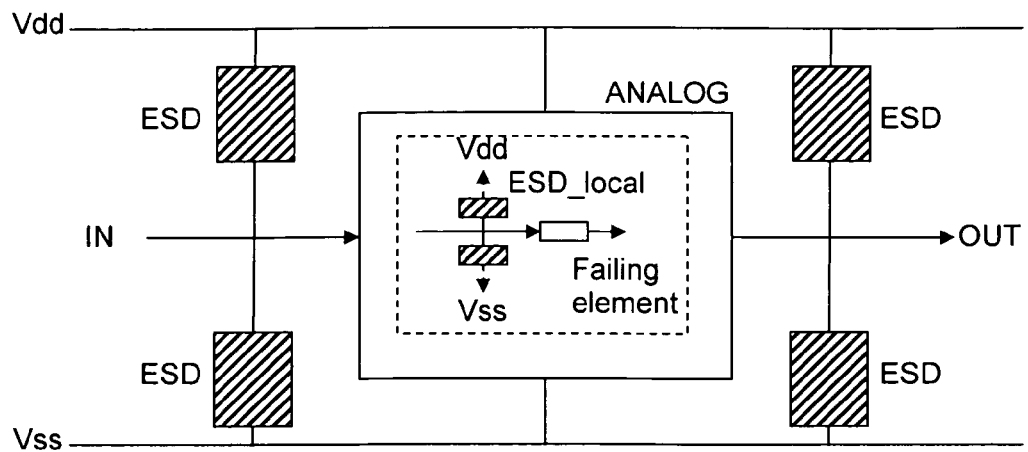
FIG. 29 shows another example of an analog circuit, according to the invention.
Figure 30:
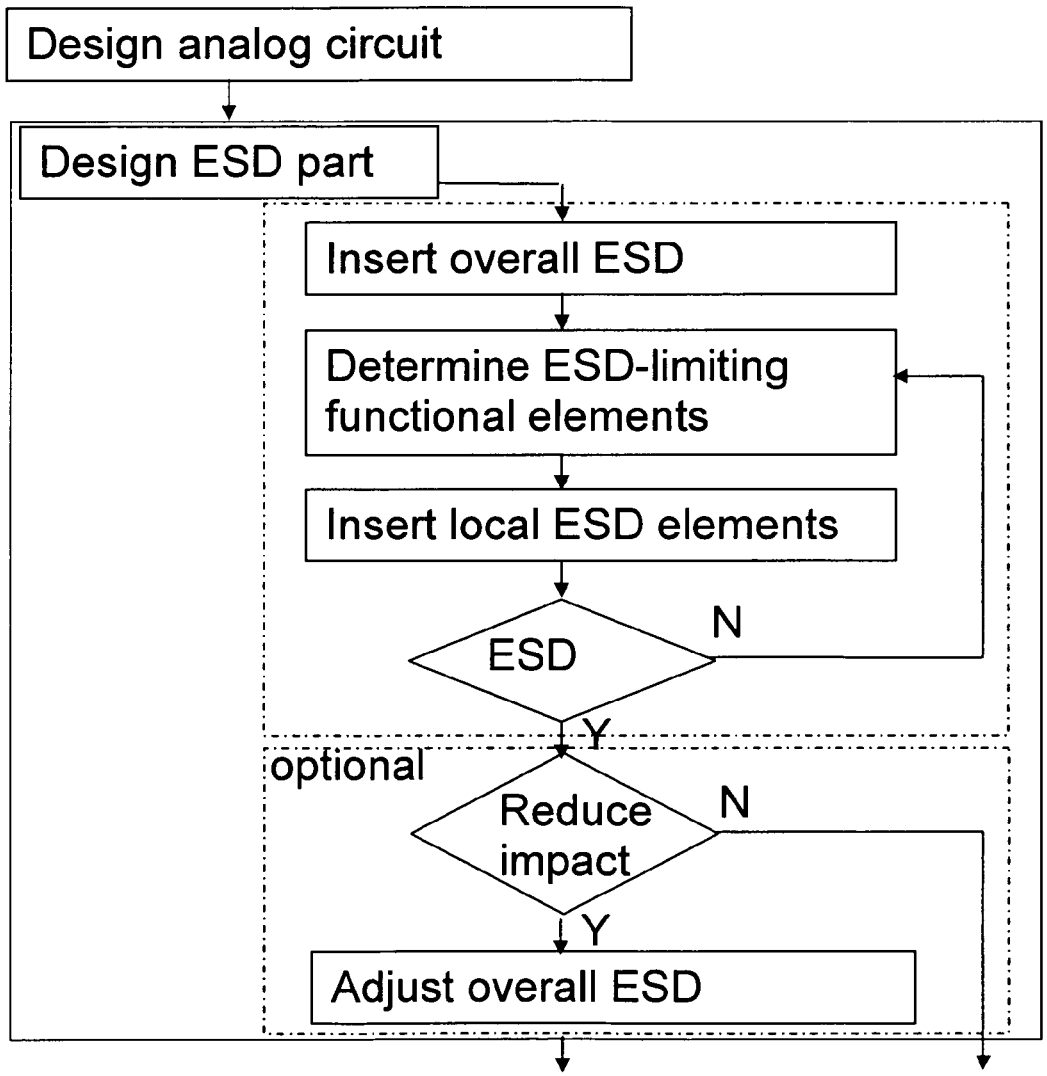
FIG. 30 shows a flow chart of the method for designing a circuit, according to the invention.

FIGS. 28 and 29 show examples of analog circuits that can be designed by the method depicted in FIG. 30. The method includes creating an analog circuit design comprising a plurality of interconnected functional components with predetermined electric properties for achieving a predetermined analog performance during normal operation of the circuit. ESD protection is added to the analog circuit design. First, the design is considered on circuit level and "overall" ESD protection components with electric properties in view of achieving a predetermined ESD robustness are added. These are the large ESD blocks in FIGS. 28 and 29. Alternatively, one could also co-design the ESD blocks with the functional components.

Next, the design is considered on component level and at least one ESD event is simulated to identify at least one weak spot in the circuit, i.e., the ESD-limiting functional elements indicated as the "failing element" in FIGS. 28 and 29. In the simulation, it is determined which electrical signals, i.e., voltages/currents are present on every component during an ESD event. Failure of the overall circuit, even in the presence of the "circuit-level" ESD protection components, can then be attributed to one or more specific functional elements or parts thereof, e.g., a transistor: in particular the gate oxide or the source/drain junction, a bipolar transistor: in particular the emitter/base junction, etc. These functional elements or parts thereof form the so-called weak spots which are identified by means of the simulation.

Following the identification of a weak spot, local "component-level" ESD protection components are added around it to protect this specific functional element from failure during an ESD event which would, in absence of the additional ESD protection, cause its failure. The component-level ESD protection components are the "local ESD" blocks of FIGS. 28 and 29. The steps of determining a weak spot and adding local protection can be reiterated a few times if necessary or if desired to further enhance the ESD protection level. In this way, one can check once again the overall circuit to see which other functional component is the next to fail and might need additional local protection.

The component-level ESD protection components are chosen of such a small size that their addition to the analog circuit design has substantially no influence on the analog performance during normal operation. In this way, ESD robustness can be enhanced without deteriorating analog performance. Furthermore, due to the small size of the added components, no additional space has to be reserved in the circuit design for the additional ESD protection and the layout of the original circuit design can be maintained.

On the contrary, the circuit-level ESD protection components may have an impact on the analog performance. Therefore, the method of FIG. 30 includes evaluating the electric properties of the circuit-level ESD protection components and, if necessary, adapting them to reduce their impact on the analog performance during normal operation. As the ESD failure is shifted due to the local component-level ESD protection components, possibly the settings for the circuit-level ESD protection components can be changed as the overall ESD performance has improved.

Figure 27:
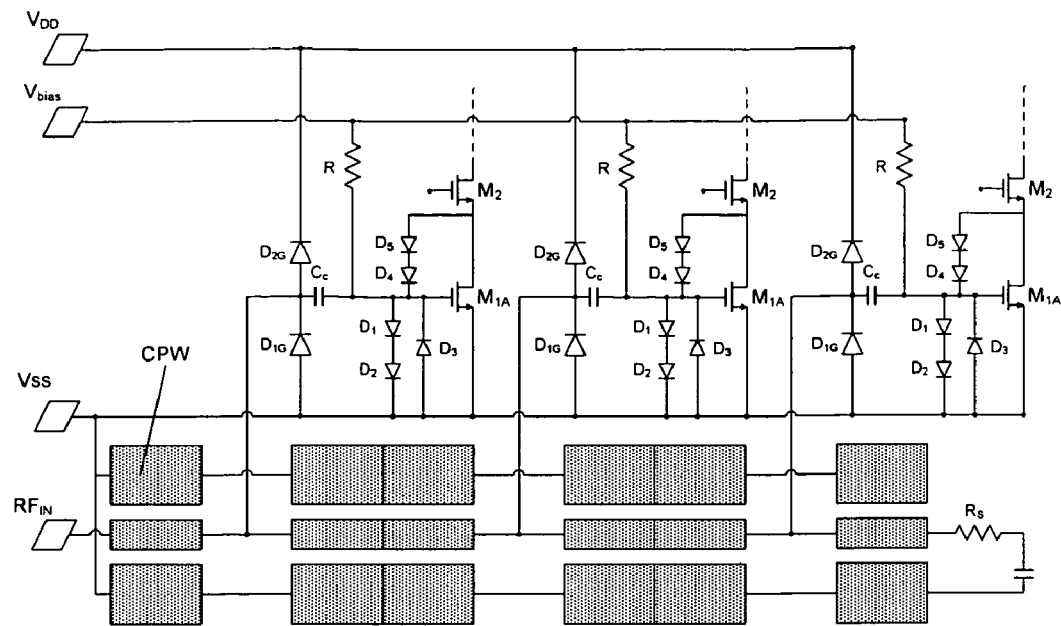
FIG. 27 shows the distributed amplifier with added circuit-level and component-level ESD protection.

The method depicted in FIG. 30 can, for example, result in the analog circuits shown in FIG. 1 and in FIG. 27. In the first example of FIG. 1, the circuit-level ESD protection components are indicated by boxes A, whereas the component-level ESD protection components are indicated by box B. These examples will now be described in further detail.

FIRST EXAMPLE OF AN ESD-PROTECTED ANALOG CIRCUIT ACCORDING TO THE INVENTION: A LOW NOISE AMPLIFIER (LNA)

I. Introduction

Deep sub-micron RF CMOS technology is becoming the 'enabling' technology for the exploding market for portable and wireless applications. For instance, the 90 nm CMOS technology node offers cut-off frequencies well over 100 GHz and the potential of this technology for low-power RF front-ends has been demonstrated by D. Linten, et al., "Low-power 5 GHz LNA and VCO in 90 nm RF CMOS", Accepted at VLSI Symposium 2004. However, downscaling introduces additional reliability concerns for the final product, which needs to be resolved. Among these reliability concerns, protecting the product against ElectroStatic Discharge (ESD) will become a limiting factor, especially with thinner gate oxides.

Implementing a suitable and sufficient level of on-chip ESD protection for RF CMOS applications is a very challenging task, and requires addressing both design and technology limiting challenges. In an RF front-end, the LNA is one of the critical building blocks. The LNA, being connected to the outside world through its antenna can, therefore, easily be exposed to ESD stress events. Incorporating sufficient and suitable ESD protection on the LNA requires that the added ESD protection does not degrade the designed functional performance parameters of the LNA.

A number of reports have highlighted the use of inductors to shunt the ESD current from the core circuit, without disturbing the RF signal propagation. These involve an on-chip inductor implemented either as a tuned resonator or filter, or as an off-chip component, mostly realized in relatively older technologies (>0.25 µm). However, its implementation is not trivial and requires extensive simulations and custom design of suitable inductors, or adaptation of the functional core to fit the available inductor values.

In the embodiment described below, the ESD inductor is added as "plug-and-play", i.e., without altering anything to the original design. The technology and the LNA architecture used are briefly described in the next section, followed by the description of the "plug-and-play" approach used for the ESD protection strategy. Correlated RF and ESD simulation and measurement data are presented along with observed problem areas. These are used to propose an optimization of the ESD protection based on simulation. In the final section, possible ESD reliability problems are identified for each pin and improvements are suggested to enhance the ESD robustness of the full circuit.

II. Technology and LNA Design

The LNA circuit that is to be protected (see FIG. 1 without boxes A and B) employs a common source topology (transistor $M_1$) with a cascode transistor $M_2$. It is matched to 50 Ω at both input and output for measurement purposes. A 50 Ω input impedance matching is achieved using a source degeneration inductor, $L_s$. [P. Leroux, et al., "A 5 GHz CMOS Low-Noise Amplifier with Inductive ESD Protection Exceeding 3 kV HBM", in Proc Eur. Solid-State Circuits Conf., Sept. 2004, pp. 295-298.] Inductor $L_G$ is used to tune-out the remaining capacitive impedance at the gate of $M_1$. A capacitive impedance divider consisting of MIM capacitors $C_1$ and $C_2$ achieves the output matching.

The LNA circuit employs a common source topology (transistor $M_1$), which is matched to 50 Ω at both input and output. By using a single amplification stage, power consumption is reduced and degradation of linearity is prevented. The cascode transistor $M_2$ reduces the Miller effect, significantly lowering the input capacitance seen at the gate of input transistor $M_1$. It also improves reverse isolation, increasing the stability, and the decoupling of the input and output impedance matching design.

The input impedance matching (S11) is achieved using a source degeneration inductor, $L_S$. [D.K. Shaeffer, et al., "A 1.5 V 1.5 GHz CMOS Low Noise Amplifier", is IEEEJ, Solid-State Circuits, vol. 32, pp. 745-759, May 1997.] Inductor $L_G$ is used to tune-out the remaining capacitive impedance at the gate of $M_1$. The MIM (metal-insulator-metal) capacitor $C_c$ is used to couple the RF signal from Vin onto the DC bias. The output matching (S22) is achieved by a capacitive impedance divider consisting of MIM capacitors $C_1$ and $C_2$. It adds the amount of capacitance to resonate with the load inductor $L_{load}$ at 5.5 GHz and to transform the impedance level at the drain of $M_2$ to 50 Ω.

The LNAs have been fabricated in 90 nm RF CMOS process on p-type 20 Ωcm Si substrate with a five-level standard copper interconnect structure. Passive components including MIM capacitors (Oxide-Nitride-Oxide (ONO) dielectric) and inductors are available in this process. The inductors have a grounded patterned poly-shield, with the top two copper metal patterns that were shunted with vias in order to create a thick top metal level of approximately 1.3 μm. The values of $L_G$, $L_{load}$, and $L_s$, are 4 nH 1.1 nH, and 0.4 nH, with a quality factor of 5, 6.5, and 7.5 at 5 GHz, respectively. The minimum physical gate length of the MOSFETs is 65 nm with an effective oxide thickness of 1.5 nm and the NMOS transistor can achieve a $g_m$, $f_{MAX}$ and $f_T$, of 1250 mS/mm, 270 GHz and 170 GHz, respectively. MOS Model 11 parameters have been used for circuit simulations.

III. Circuit-level ESD Protection Strategy

After the design of the LNA, circuit-level ESD protection devices are added as "plug-and-play" components, as it is done for digital circuits. Inductors ($L_{ESD}$) are placed at both input and output of the LNA to divert the ESD current away from the LNA core to the power lines. The ESD pulse has a low frequency when compared to the RF operating frequency.

A grounded gate NMOS device, $M_{ESD}$, is used as power clamp at the power supply node Vdd (FIG. 1). The ggNMOS can be sized as big as desired because no RF signal is present at this pin. Since all used ESD protection devices work bi-directionally, all possible pin-to-pin combinations are protected against ESD stress.

Figure 2:
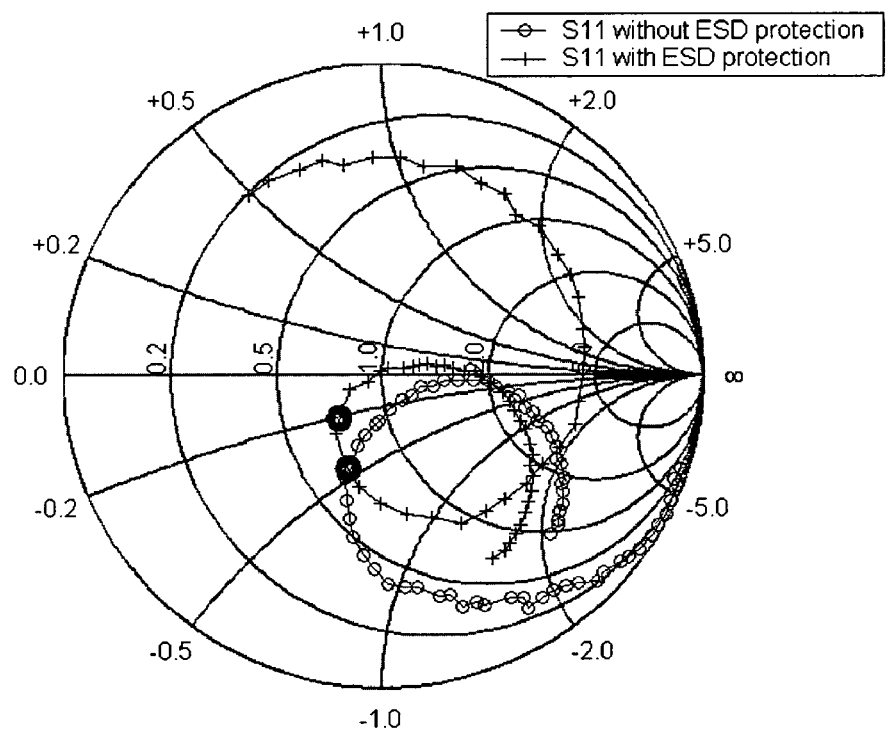
FIG. 2 shows a Smith chart representation of measured S11 data for the LNA of FIG. 1 with and without ESD inductors. Dots mark the 5.5 GHz point. At 5.5 GHz, the LNA remains matched to 50 Ω.

The measured input matching of the LNA with and without ESD inductors is plotted in FIG. 2. By placing the ESD inductor, at low frequencies a low resistance is seen instead of an open, and at 5.5 GHz the matching to 50 Ω remains (black dots).

Several inductors (1 nH to 5 nH) were available from the library, and the inductor selection was based on a trade-off between RF and ESD requirements. Simulations were performed to select the optimal inductor and they clearly demonstrate this trade-off. Measured S-parameter data for the different inductors was integrated into the simulation as this increased the confidence in the simulation results.

Figure 3:
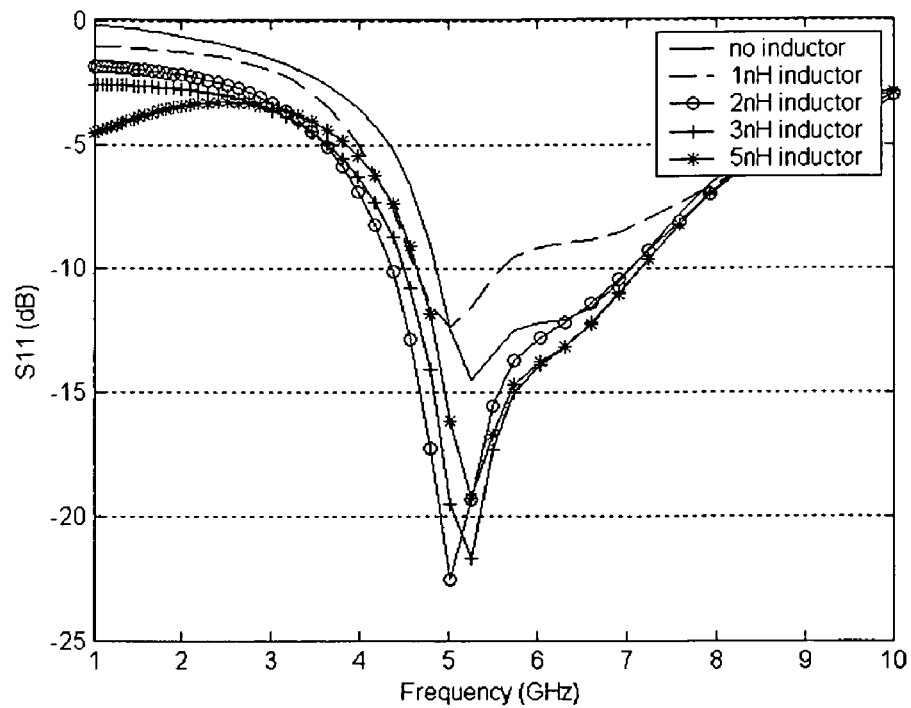
FIG. 3 shows a graph of the simulated input matching for different values of ESD inductors. All inductors fulfill the requirement of S11<−10 dB.

FIG. 3 shows the simulation results of S11 for different values of the ESD inductor. All inductors fulfill the requirement of S11<−10 dB at 5.5 GHz and due to the additional ESD inductor S11 sometimes even improves. Simulations of S22 show similar results.

Figure 4:
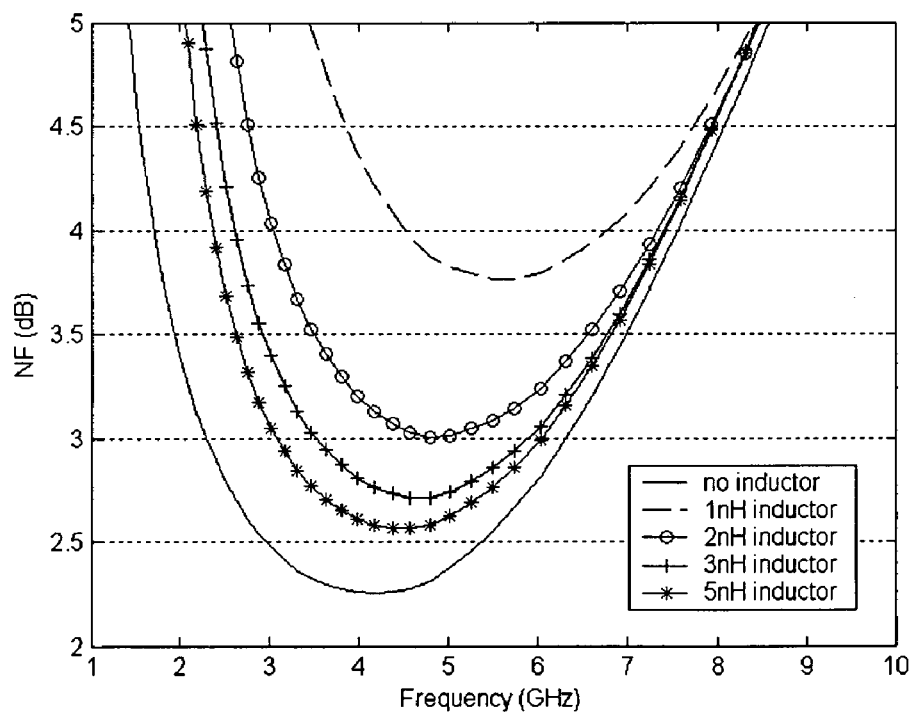
FIG. 4 shows a graph of the simulated noise figure for different values of ESD inductors. For a NF of maximum 3 dB, all inductors except 1 nH can be used.

Since the noise of the LNA is mostly determined by the elements at its inputs, an increase in noise figure (NF) is to be expected by adding the additional inductor $L_{ESD}$. Therefore, NF simulations were performed and as shown in FIG. 4, for a NF of maximum 3 dB, all inductors except 1 nH can be used.

Simulations of the power gain (S21) did not reveal any significant dependence on the value of the ESD inductor.

A measure for the level of ESD protection is the Human Body Model (HBM) test pass voltage. With a HBM test a capacitance of 100 pF is discharged through a 1.5 kΩ resistor, while it is connected to the device under test (DUT), resulting in a 150-nanosecond, double-exponential pulse. The standard level of ESD protection is 2 kV and refers to the ability of the on-chip ESD protection to conduct 1.34 A during an ESD event (~150 ns for HBM pulse) away from the sensitive core circuit, and to limit the voltage of the protected node to a safe level. All pin-to-pin combinations have to be protected against the ESD stress.

Transmission-line pulse (TLP) testing is traditionally used to characterize the on-chip ESD protection structures and evolved as one of the most useful tools to reduce the ESD protection design cycle time. A TLP tester employs a rectangular pulse with energy ranges similar to those used in HBM ESD qualification testing. This allows for correlation between TLP (with rectangular pulse widths of 75-200 nanoseconds) and HBM. Here both TLP and HBM tests are performed.

The HBM ESD pulse frequency spectrum is limited to about 1 GHz. Therefore, it can be separated from the RF signal ($f_o$=5 GHz) at the RF pins by providing a low-impedance path towards the ground at frequencies less than 1 GHz. This can be achieved by inserting suitable inductors ($L_{ESD}$) at both input and output of the LNA (FIG. 1) to sink the ESD current at the RF pins away from the LNA core to the ground lines. The selection of the inductor $L_{ESD}$ depends on a RF-ESD trade-off. From RF point of view this inductor should not degrade the input matching constraint and noise figure around the operating frequency $f_o$ of the core LNA. At $f_o$, $L_{ESD}$ resonates with the parasitic capacitances of the RF pad and the AC-coupling capacitor $C_c$, needed in order not to influence the DC operating point of the LNA. The remaining equivalent parallel resistance of the ESD inductor at resonance is:

$$R_{p,ESD} \cong \frac{\omega_o^2 L_{ESD}^2}{R_{ESD}} \quad (1)$$

where $R_{ESD}$ is the series loss of the inductor $L_{ESD}$. The input matching constraint of the LNA is not degraded at $f_o$ if $R_{P,ESD} \gg Rs = 50\,\Omega$. In practice, $R_{p,ESD}$ is in the order of k$\Omega$. Under this condition, the gain is unaffected and the noise factor increase is approximated by $$F_{ESD} \cong \frac{R_s}{R_{p,ESD}}, \quad (2)$$

Human Body Model (HMB) transient simulations are performed, to determine which inductor provides the best ESD protection. When an ESD event occurs, its fast rising edge will cause a voltage overshoot across the inductor (node $V_{in}$), as the instantaneous current through it cannot be changed. The decoupling MIM capacitor ($C_c$) (see FIG. 1) couples this transient voltage onto the node Vgate, as a capacitive divider. After the overshoot, the voltage across the inductor is determined by its on-resistance. Therefore, an inductor with low on-resistance is preferable to reduce the voltage drop across its terminals as much as possible since this voltage could possibly damage the thin gate oxide of transistor $M_1$.

Figure 5:
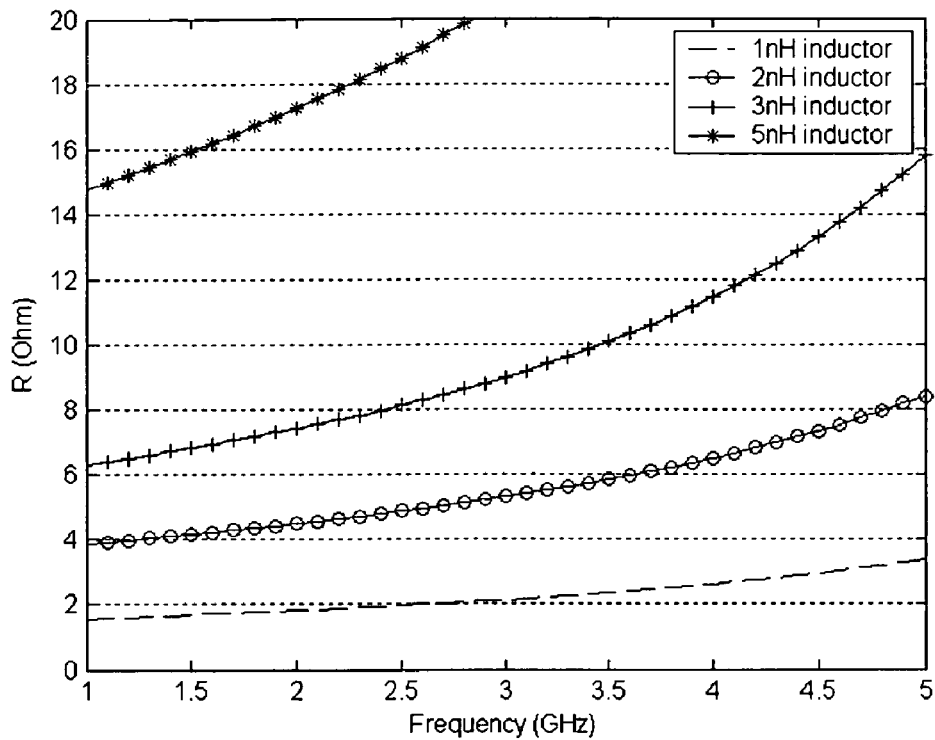
FIG. 5 shows a graph of resistance simulations of the different ESD inductors. Resistance increases with increasing inductor value, worsening the ESD protection level.

The resistance of the ESD inductors as a function of frequency (FIG. 5) shows that higher values are obtained for the larger inductor values. This is because inductors with higher inductance values are built using more turns and thinner metal lines.

Figure 6:
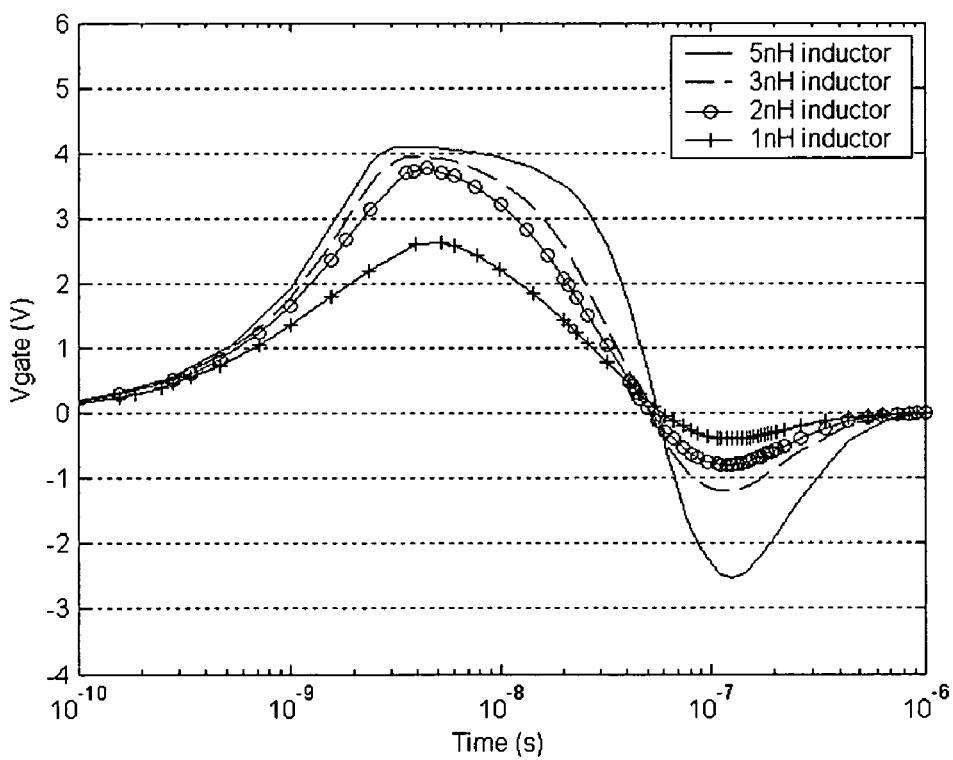
FIG. 6 shows a graph of the voltage across gate of input transistor $M_1$ during 2 kV HBM simulations, stressed input to ground, for different values of ESD inductors. The larger inductors give rise to higher voltages across transistor $M_1$.

HBM simulations shown in FIG. 6 confirm that the larger inductors give rise to a higher voltage across the oxide of $M_1$. Even though the difference in the voltages (only a few tens of a volt) might seem small, it is extremely important, because the Time to BreakDown (TBD) decreases exponentially with increasing $V_{GS}$ (~6 decades/V in this voltage range). Even, an increase in $V_{GS}$ less than 0.2 V will accelerate oxide degradation by more than one order of magnitude.

The measured breakdown voltage of the gate oxide of transistor $M_1$ during a 100 ns TLP stress was 4.1 V, as explained in section V.1 in more detail. FIG. 6 shows that during a 2 kV HBM simulation with a 5 nH inductor more than 4 V is obtained. The 3 and 2 nH inductor also reach voltages which are very close to the failure level.

Figure 7:
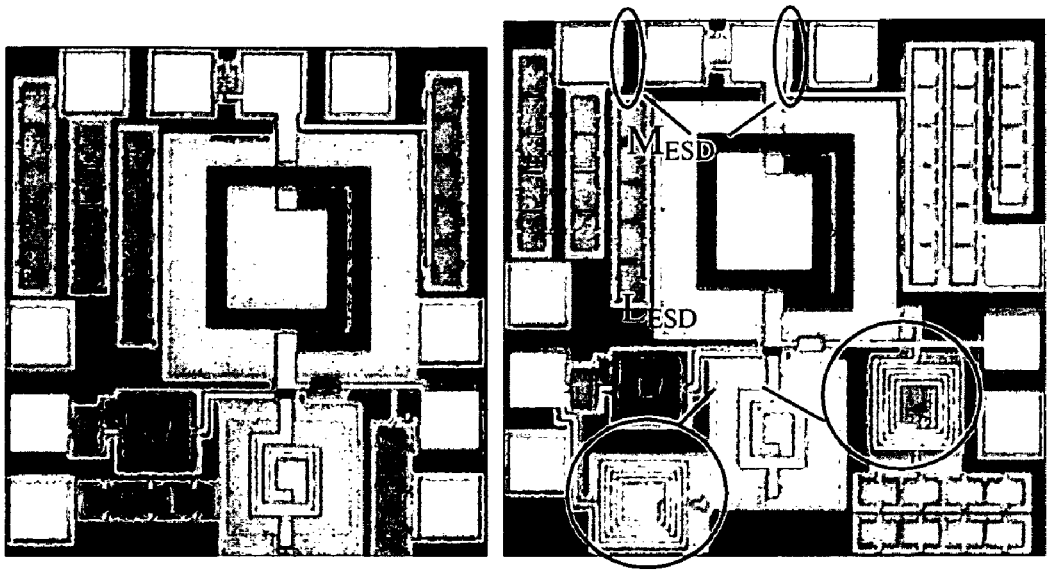
FIG. 7 shows on the left a micrograph of the LNA without ESD protection and on the right a micrograph of the LNA with circuit-level ESD protection (circles).

Based on this RF and ESD analysis, and since the LNA was designed with a bigger emphasis on the RF functionality than on ESD behavior, the 3 nH inductor was chosen as ESD protection inductor at both input and output because of its lower NF. For comparison, the LNA was fabricated with and without the added ESD protection. A micrograph of both is shown in FIG. 7. In the next section, RF and ESD experimental results are discussed.

IV. Experimental results

In this section, both RF and ESD measurement data are presented.

Figure 8:
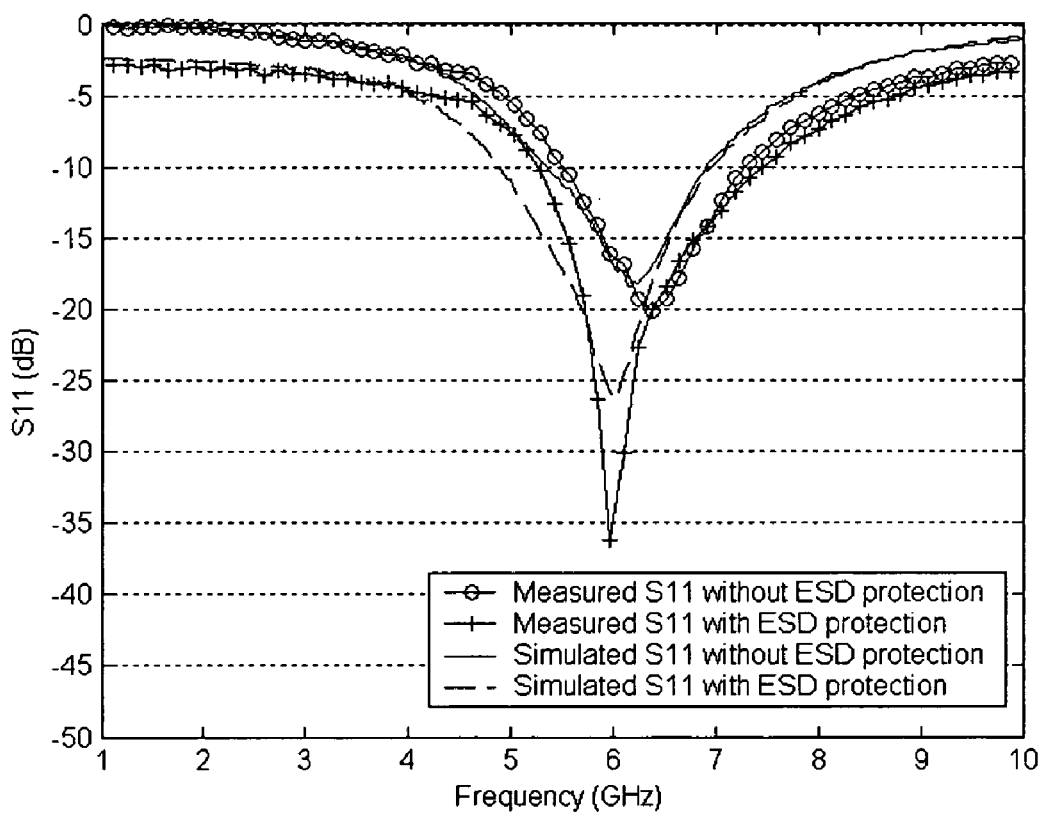
FIG. 8 shows a graph of the measured and simulated input matching S11 for the LNAs with and without ESD inductors. A good agreement is seen. The difference at low frequencies is because of the series resistance of the ESD inductor.

RF measurements were performed on the LNAs with and without ESD protection. These include S-parameter, NF, and 1 dB compression point measurements. Both designs achieve very good results as shown in Table 1. Although S11 was shifted marginally to higher frequencies for both LNAs when compared to simulation, the results were still on target. This shift is identified as due to an inaccurate source degeneration inductor model, and a silicon verified updated model for this inductor proved it. FIG. 8 shows a comparison between the measured and the updated simulation of the input matching. A good agreement is seen, and this gives also additional confidence in all simulation results shown here.

Figure 9:
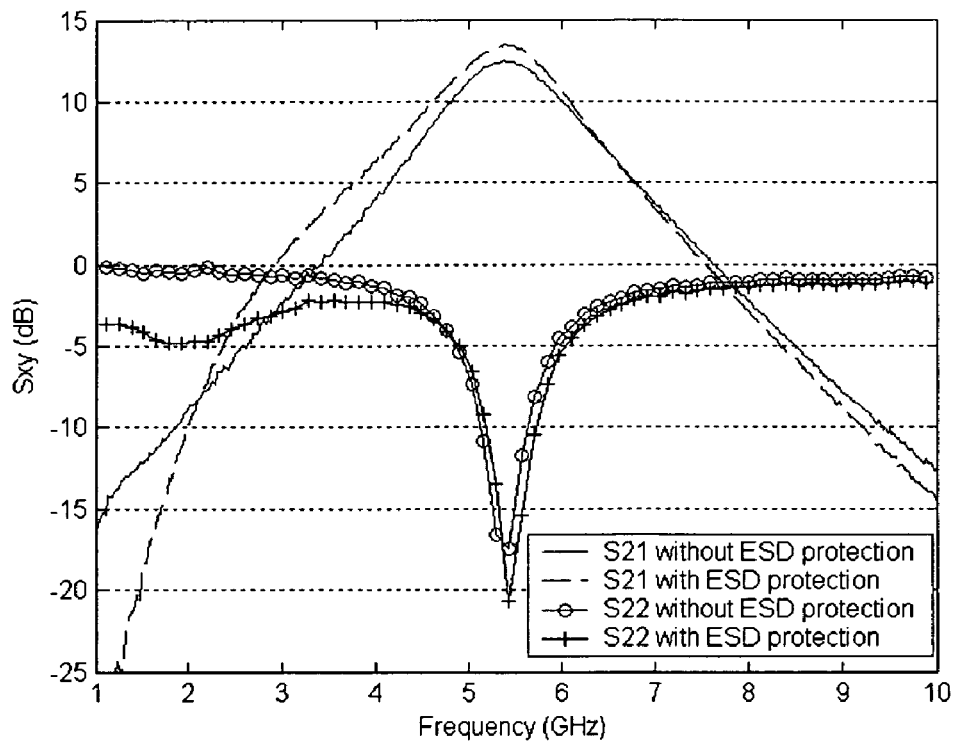
FIG. 9 shows a graph of the measured gain S21 and output matching S22 for the LNAs with and without ESD inductors. The difference at low frequencies of S22 is because of the series resistance of the ESD inductor.

Input matching is improved using the ESD inductor, resulting in a small increase in gain, as can also be seen in FIG. 9, which also shows the measured output matching. When adding the ESD inductor at the output, the output matching remains nearly unchanged around 5.5 GHz.

Figure 10:
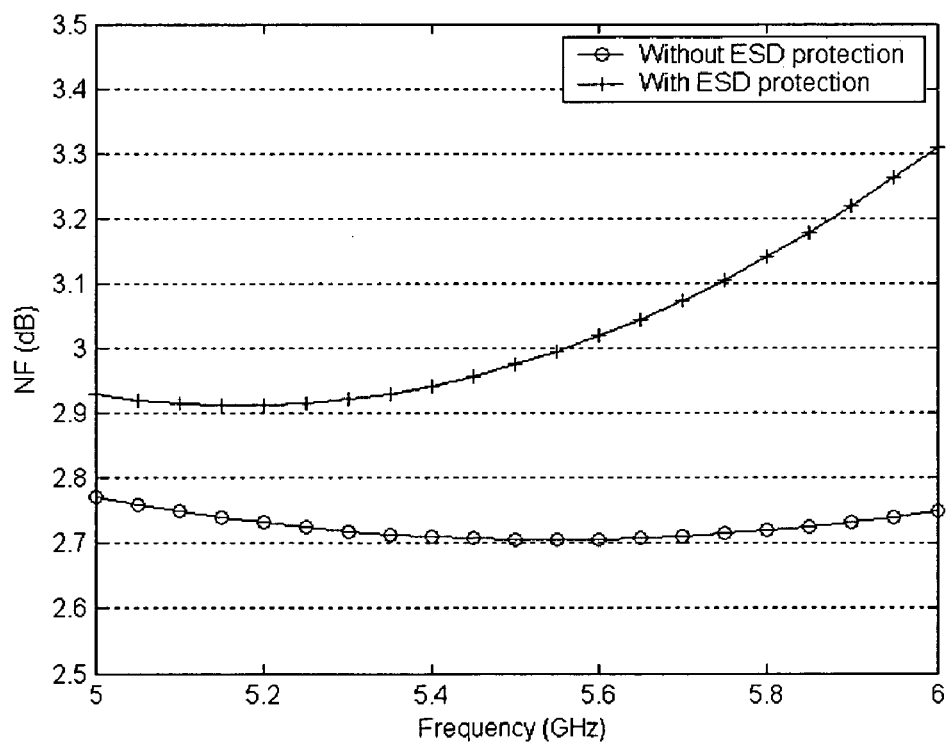
FIG. 10 shows a graph of the measured noise figure NF for the two LNAs with and without ESD inductors. An increase in NF is seen because of the added ESD inductor.

FIG. 10 shows the measured NF for both LNAs. A 0.3 dB increase in NF is observed. All these results fit very well with the simulation results.

Next, the ESD behavior is analyzed for all pins, Vin, Vout and Vdd.

IV.1. RF Pins: Vin and Vout

As mentioned, the input pin was protected using $L_{ESD1}$, a 3 nH inductor (FIG. 1). This inductor was characterized by measuring it in stand-alone configuration using a 50 $\Omega$ TLP measurement system. The inductors could withstand a current of 4.7 A with 33 V across it. For comparison, TLP measurements were performed on the full circuit, where ESD stress was applied positive on the input pad with respect to ground. Normally, during ESD testing between two pins, all other pins should be left floating. However, it should be noted that if Vbias is not grounded in this case, it could lead to additional problems described below. As mentioned before, the Vbias pin will not be present in any actual design.

Figure 11:
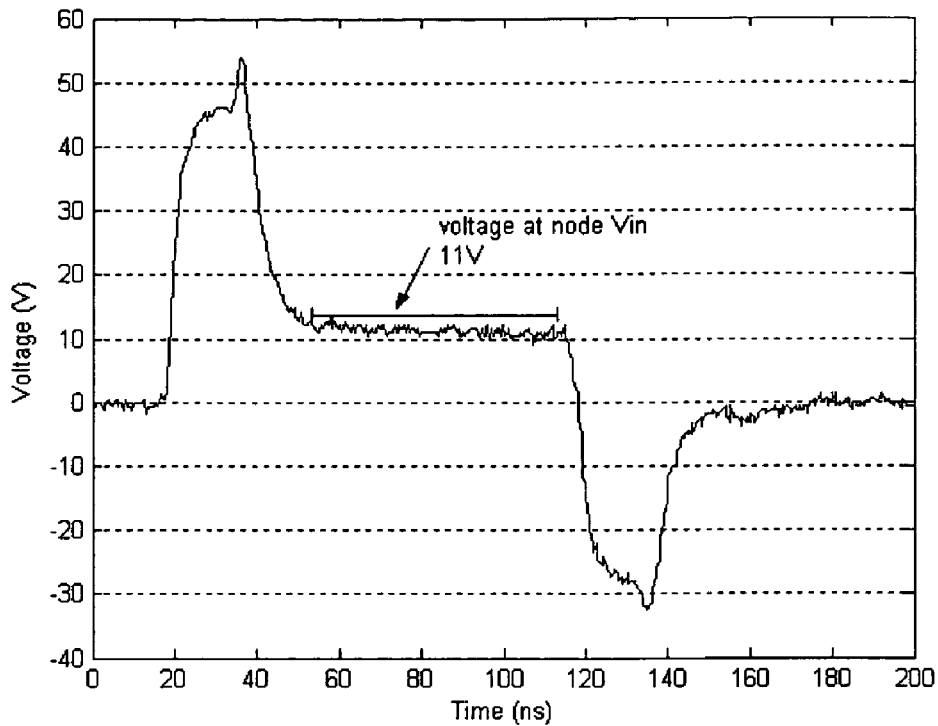
FIG. 11 shows a graph of the measured voltage during a 100 ns TLP stress of 1.46 A between Vin and ground. The waveform is the result of the partially overlapping incident and reflected waveforms. 11 V is built up at the input node Vin, which is partly coupled onto the gate of $M_1$.

The full circuit could withstand at its input 1.46 A TLP stress before failure. During this stress, 11 V develops across the ESD inductor, as can be seen in FIG. 11. This figure shows the measured voltage waveform using a 50 $\Omega$ TDR TLP system, where part of the incident and reflected waveforms overlap.

If the bias node was not grounded during ESD testing, then the node at the gate of $M_1$ is floating, resulting in failure at only 1 A TLP stress. This is because the voltage, which appears during ESD stress, can only leak away through the gate leakage of transistor $M_1$. This causes that voltage to remain there during a few ms, degrading the gate oxide. By having a resistor of a few k$\Omega$ between that node and ground, the node discharges to zero within the first μs, obtaining the higher ESD capability. This effect can be easily simulated as well. Therefore, designers should always be aware of such potential hazards with floating nodes.

A full RF measurement is normally performed after any ESD stress to make sure no RF degradation has occurred. However, during ESD testing, a quick method is needed to detect failure. Since the inductor only has a few ohms of resistance to ground, leakage at the input node cannot be used as criterion. Therefore, another criterion is needed. If during monitoring of the leakage at the Vbias node (if this node is present in the design) the bias resistor R is measured, most likely the gate oxide of $M_1$ has failed. Without failure, an open circuit should be seen here. Another possible criterion is to use the leakage at the Vdd node. During positive bias at this node, transistor $M_2$ goes into strong inversion, such that any damage at transistor $M_1$ can be monitored. This is much more sensitive than monitoring at Vbias, because now there is not a big (k$\Omega$) resistor in series in the leakage path.

For qualification purposes, HBM measurements are performed to characterize the circuit and not TLP. Two HBM testers were used, with a rise time of 2 ns and 20 ns respectively. With the first HBM tester, the circuit passed only 300

V, whereas with the second HBM tester the circuits could withstand up to 1 kV. Thus, a clear influence of rise time is seen.

Figure 12:
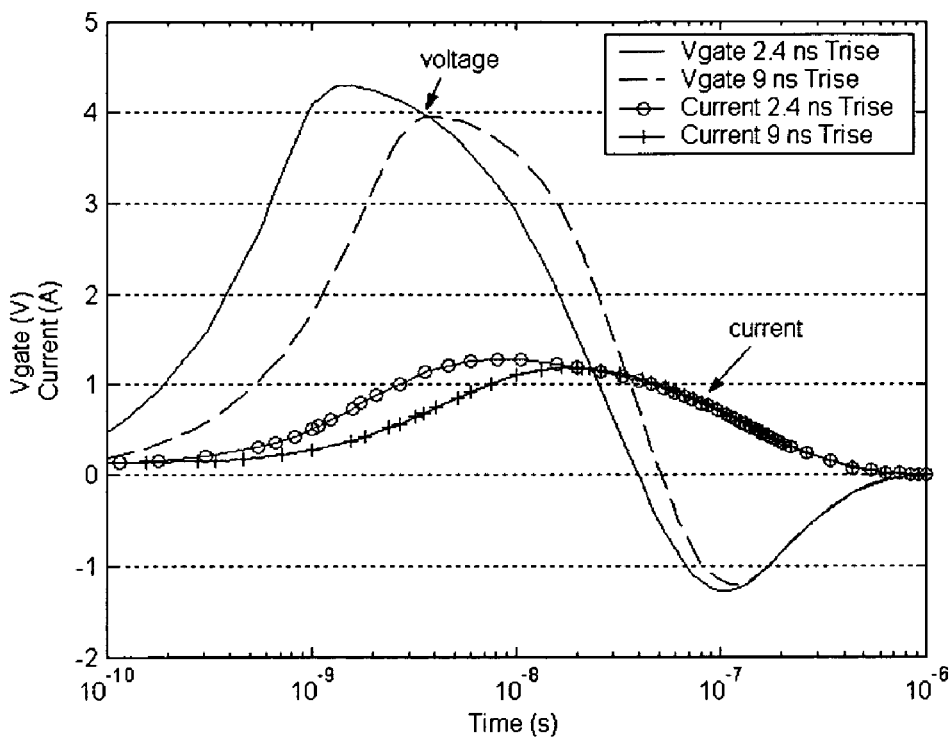
FIG. 12 shows a graph of the 2 kV HBM transient simulation, stressed input to ground for a pulse with fast (2.4 ns) rise time, and slow (9 ns) rise time. The faster rise time results in a higher voltage at the gate of $M_1$ and, thus, failure at lower current levels.

This effect is illustrated using the results of HBM simulations for two HBM pulses, of 2.4 ns and 9 ns rise time respectively as shown in FIG. 12. The difference in Vgate is about 0.4 V, and as mentioned before this severely impacts the gate oxide reliability. This effect causes the gate oxide of $M_1$ to fail at lower current levels when using a HBM pulse with a faster rise time.

Since the HBM ESD standards specify a wide range of rise times (2-10 ns on a short), these results show the importance of specifying the rise time used, when HBM results on circuits in technologies of 90 nm and below are presented.

Even for the HBM measurement with the slowest rise time, 20 ns, the circuit could withstand only up to 1 kV instead of the targeted 2 kV. This was found to be due to the voltage overshoot in the HBM testers itself, destroying the sensitive gate oxide.

Figure 13:
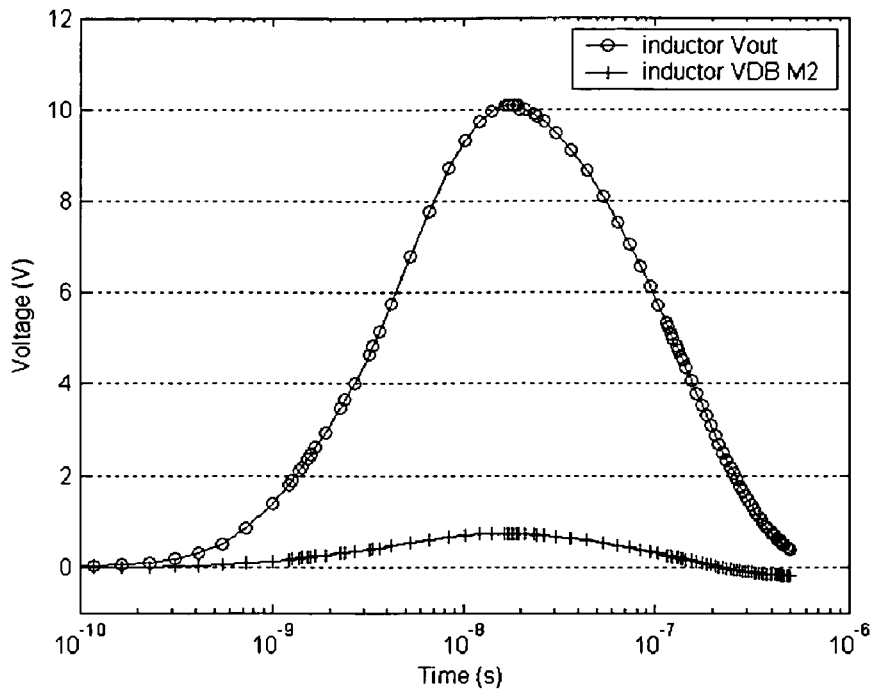
FIG. 13 shows a graph of the 2 kV HBM transient simulation on the output node $V_{out}$. The voltage coupled onto the drain node of $M_2$ stays below 1 V and is not posing any additional reliability problems.

The output was also protected by a 3 nH inductor $L_{ESD}$ (FIG. 1). During an ESD event, the principle of its operation is the same as for the input, i.e., the voltage is capacitively coupled across the capacitor of the output matching onto the drain node of $M_2$ (FIG. 1). However, since this capacitance is much smaller than the capacitance seen at the drain node of $M_2$, the coupled voltage is rather small (see FIG. 13), and the core RF transistors remain unstressed. HBM measurements with 2 ns rise time yielded more than 2 kV protection.

IV.2. Power Pin: Vdd

Figure 14:
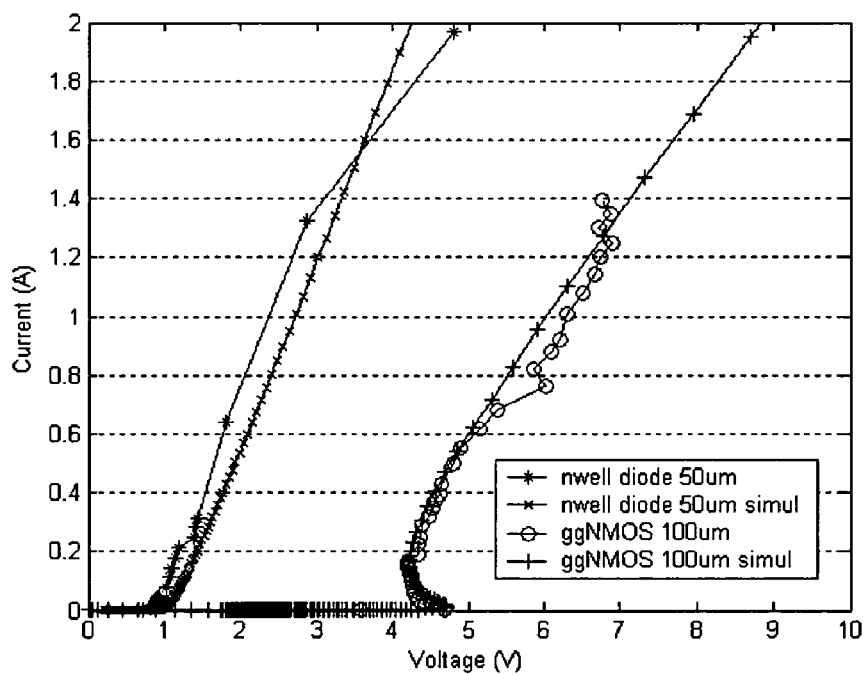
FIG. 14 shows a graph of 50 Ω TLP measurement data for diodes and ggNMOS devices and corresponding simulations with respective ESD device models.

The power pin Vdd is protected by a grounded gate NMOS (FIG. 1). The ggNMOS has a width of 100 μm and a gate length of 0.25 μm. 50 Ω TLP measurement data of this device, stressed in snapback mode (i.e., drain positive versus source/substrate/gate) is shown in FIG. 14. The power clamps are able to conduct 1.4 A of TLP current. The voltage developed at this current is about 7 V.

When stressing the ggNMOS in the negative polarity, the current is conducted mainly by the Psubstrate/N+drain diode and more than 4 A TLP $It_2$ could be reached. In the next section, improvements are suggested to increase the ESD robustness for all pins to be protected.

V. Weak spots and component-level ESD protection strategy

Extensive simulations were performed to determine the best possible sized device that can be used to protect the various pins (Vin, Vout and Vdd), as well as, to identify and fix the ESD weak spots in the circuit.

For both the input and output, inductors are used as protection elements and the ESD behavior of the full protected circuit is discussed in section V.1 for both pins.

The protection for the power pin Vdd is discussed in section V.2. Compact models valid under ESD time and current domain for two devices, n-well diode and ggNMOS, were extracted from dedicated test structures and used for circuit simulations under HBM transient conditions. The compact model for the ggNMOS was used to investigate the ESD behavior of the power clamp. From the diode test structures, a compact model was extracted that is valid in both RF and high current domains. This diode model is used in section V.2 when a diode string would be used as power clamp and also in sections V.1 and V.2 as RF diode model for very small diodes.

FIG. 14 shows the TLP IV measurement results along with the ESD compact model device simulation results on these two types of devices. Data is shown up to $It_2$, i.e., the maximum current before an increase in leakage current is seen. From the figure, it is clear that one can use the ESD compact models for these devices with high confidence for full circuit simulations, especially for optimization purposes.

V.1. RF Pins: Vin and Vout

During ESD stress between input and ground, the voltage developed across the inductor is capacitively coupled onto the gate of transistor $M_1$, stressing the sensitive gate oxide. The breakdown voltage of the 1.5 nm oxide during a 100 ns positive TLP pulse (gate stressed to source/drain/bulk) was measured to be at 4.5 V, and −5.25 V for the reverse polarity. When the voltage on the gate crosses these boundaries during an ESD event, the thin gate oxide fails and, thus, limits the ESD robustness of the full circuit.

Figure 15:
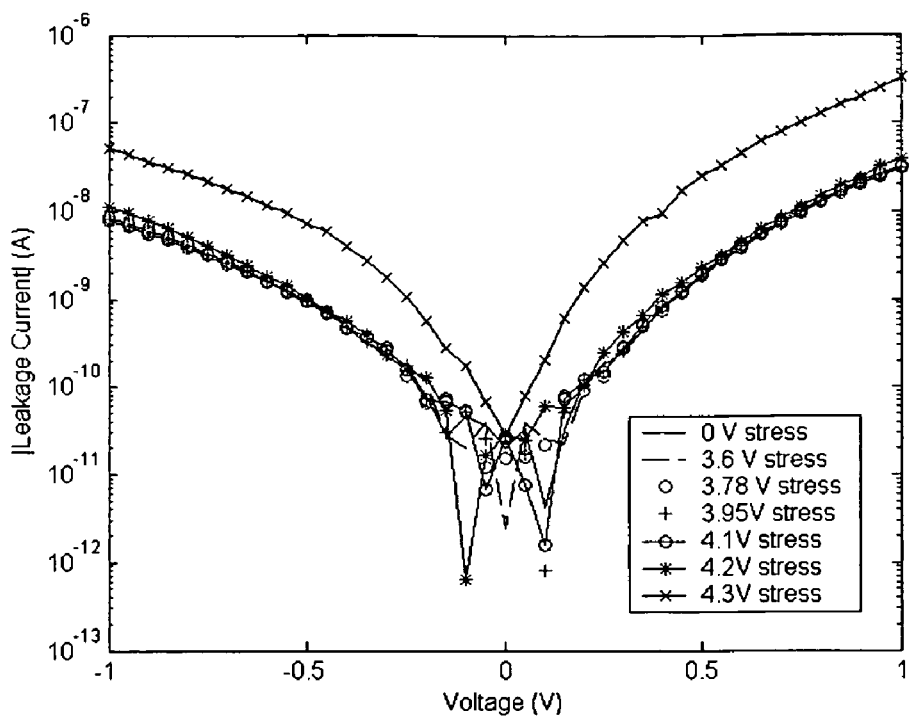
FIG. 15 shows a graph of the absolute value of leakage currents of the gate oxide of the RF transistor for different stress conditions. When applying a 100 ns voltage stress of 4.2 V on the oxide, a small increase in leakage current is seen. Therefore, the failure level is chosen to be at 4.1 V.

So the gate oxide of transistor $M_1$ is the weakest spot of the circuit during ESD stress at the input and, therefore, TLP measurements were done on a stand-alone RF-transistor (the same used as in the circuits). It's gate was stressed with source, bulk and drain grounded. The breakdown voltage of the 1.5 nm oxide during a 100 ns pulse was measured to be at 4.1 V as seen in FIG. 15.

The 2 kV HBM simulation, stressed input to ground (FIG. 16, 3 nH curve), yielded almost 4 V across the gate of $M_1$ which is very close to this breakdown value. Since this is only a simulation result, the real voltage at the gate could differ and be even a bit higher. Moreover, taking statistics into account and to make sure that 99.9% of all oxides are not degraded, the maximum allowed voltage should be lowered to 3.8 V (according to Weibull statistics). This voltage was calculated based on R. O'Connor, et al., "Weibull Slope and Voltage Acceleration of Ultra-thin (1.1-1.45 nm EOT) Oxynitrides", Proc. INFOS, paper GS26, 2003, with a Weibull slope β of 1.5 and a voltage acceleration factor γ of 6dec/V.

From the above, it appears that additional precautions have to be taken such that the voltage at the gate oxide always is clamped to a safe value, positive or negative, to prevent any degradation. Therefore, simple, fast clamp devices, such as diodes, can be placed close to the gate. The solution is found in the diodes D1-D3 shown in box B in FIG. 1.

These small diodes are used at the gate of $M_1$ ($D_1$-$D_3$ in FIG. 1) to clamp this voltage to a safe value, both for positive and negative events. In the LNA, the gate of $M_1$ was biased at 0.6 V, so two diodes in series from the gate to ground are needed (hence n-well diodes should be used), in parallel with a diode from ground to the gate. These diodes do not have to conduct any significant current (a few mA during a few ns) and, hence, can be sized very small from an ESD point of view. This is also ideal from RF perspective, since they should not impact the RF behavior of the circuit. Note that these diodes can be placed without altering anything to the original designed circuit. A worst-case scenario has been simulated with the compact model of a diode of 4×2 μm$^2$ capable of conducting more than 160 mA during 100 ns (since the required diodes could be made much smaller, reducing their parasitic capacitance and, hence, its effect on the RF behavior of the circuit). Each of these diodes was estimated to have a capacitance of about 11 fF and, hence, the total load on node Vgate was 16.5 fF. Plugging this into the simulator, no RF degradation could be noticed, even from this worst-case simulation. From the practical implementation point of view, due to the small footprint, these diodes can be easily placed right in front of the transistor gate as required.

Figure 16:
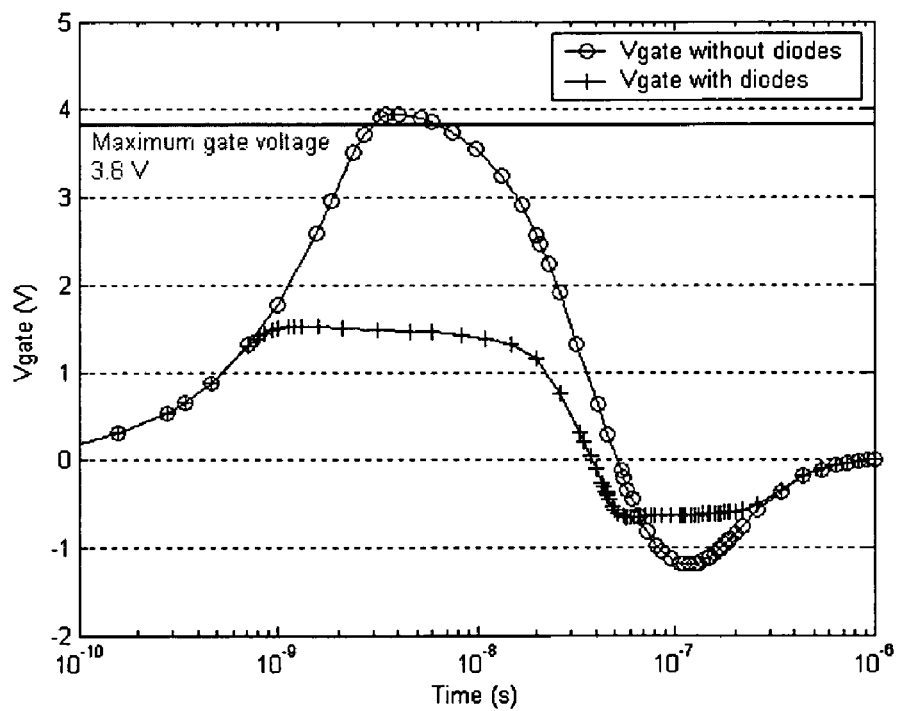
FIG. 16 shows a graph of the 2 kV HBM transient simulation, stressed input to ground, for LNA with and without additional diodes at the gate of $M_1$. With the diodes, the voltage at the gate of $M_1$ is clamped to a safe value.

FIG. 16 compares a 2 kV HBM simulation with and without the additional diodes. With the diodes, it can be seen that the voltage at the gate is clamped to a safe value of maximum 1.4 V. This prevents failure of the gate oxide, and will result in a drastic improvement of ESD robustness, since the limiting factor is shifted to the current capability of the ESD inductor or most likely to the voltage across the decoupling capacitor. Further, these diodes are also very beneficial for CDM stress protection.

Once the limitations posed by the RF transistors have been taken into account and suitable precautions are introduced, verifying which other circuit elements will become the limiting factor may be necessary. A quick look at FIG. 1 shows that the MIM capacitors ($C_i$) are the only elements in the ESD path to be investigated, as the inductors showed high ESD performance. TLP measurements were performed on these MIM capacitors, and these structures failed at about 28V, irrespective of capacitor size. For simulation and estimation purposes, a conservative failure level of 25V was assigned to the MIM capacitors, taking into account statistical measurement deviations and the possible inaccuracies in the subsequent simulations performed.

From all this, the maximum ESD robustness of the full circuit can be predicted to be about 5 kV HBM. Simulating with this stress condition, see FIG. 17, leads to a current of 3.1 A through the ESD inductor, which is below its failure level. Because of the extra diodes at the gate, the maximum voltage across the gate oxide is 2 V, and this is also within safety limits. A maximum current of 9.5 mA is flowing through the extra diodes, which is way below their maximum current level. The voltage across the MIM capacitor $C_c$ reaches maximum 23.6 V, which is near the failure threshold and, therefore, this capacitor will become the limiting element.

Figure 17:
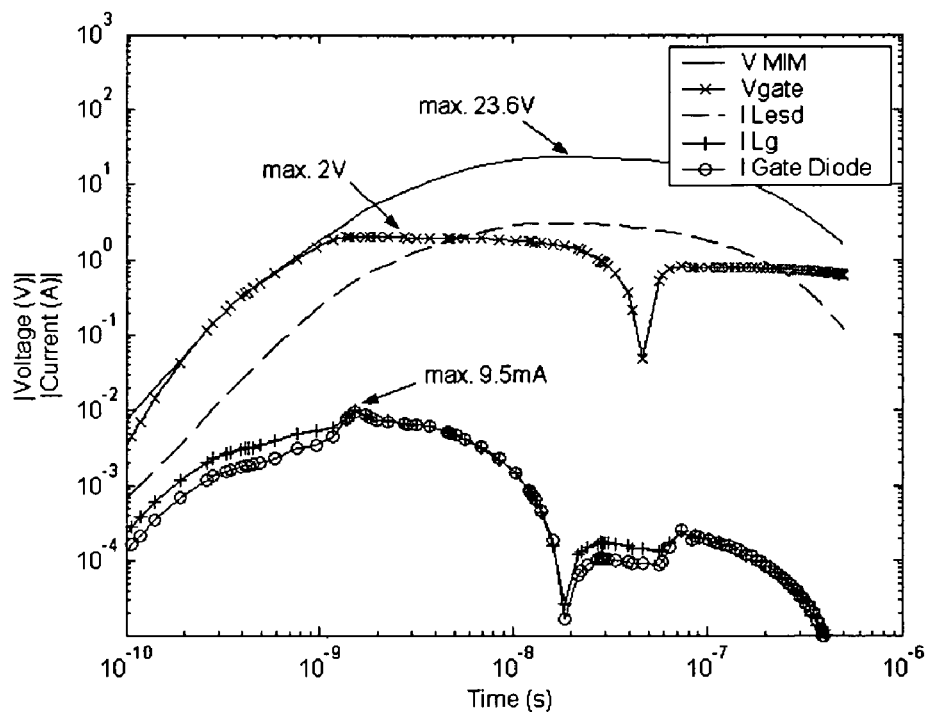
FIG. 17 shows a graph of the 5 kV HBM transient simulation, stressed input to ground. The absolute values of the most important voltages and currents are shown. The limiting element will become the voltage across the MIM capacitor, since it reaches almost its failure level, where all other voltages and current remain within safety limits.

Stressing $V_{out}$ to ground, the coupled voltage onto the RF transistors is small and, therefore, no additional problems are expected (FIG. 17). When running a 5 kV HBM transient simulation on Vout, the maximum voltage across the MIM capacitors in the output matching is around 25 V, making the MIM capacitors also the limiting element for ESD robustness at the output of the LNA, since the other voltages and currents remain within safe limits.

V.2. Power Pin: Vdd

Since ESD protection devices typically work bi-directionally, all possible pin-to-pin combinations are protected against ESD stress. In this section, both positive and negative stress on the Vdd terminal with respect to ground is investigated. It is seen that during positive stress, avalanching of the drain bulk junction of transistor $M_2$ could occur, and that the voltage across the gate oxide of transistor $M_1$ could rise too high. During negative stress, no additional problems were observed.

Figure 18:
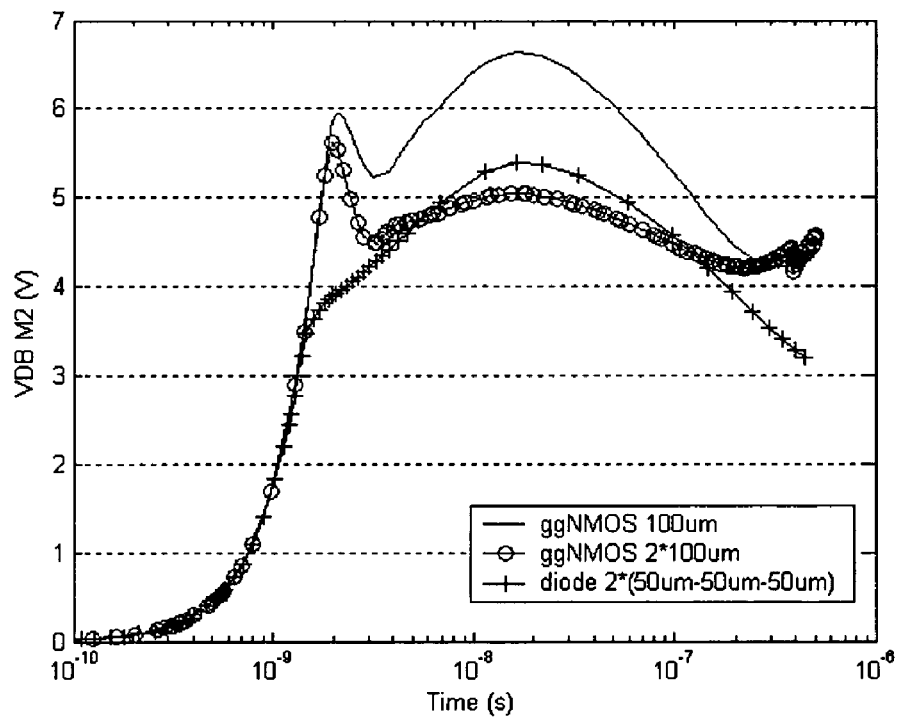
FIG. 18 shows a graph of the 2 kV HBM transient simulation on Vdd. The voltage across the drain-bulk junction of transistor $M_2$ is seen. A single 100 μm ggNMOS could cause the junction to start avalanching. Two parallel ggNMOS devices or an appropriate diode string could prevent this avalanching.

When applying positive stress on the Vdd pin with respect to ground, both the drain and gate of transistor $M_2$ (FIG. 1) are pulled high. The transistor goes into strong inversion, a channel is formed between drain and source, and this raises the source potential. Therefore, the gate oxide of transistor $M_2$ remains unstressed. One must make sure however, that the drain-bulk junction of $M_2$ does not start to avalanche, since the transistor was not designed to operate in this region and, hence, it should be avoided. Simulating the drain-substrate voltage with a 2 kV HBM stress pulse positive on the Vdd, a single 100 μm ggNMOS could give rise to avalanching of transistor $M_2$, since the voltage buildup exceeds 6 V during tens of nanoseconds as seen in FIG. 18. Putting two parallel ggNMOS devices, the on-resistance is decreased, resolving this issue. A diode string could also be used as power clamp protection. Three diodes in series may be needed, since the Vdd is 1.2 V. A simulation was performed with two parallel strings of three diodes of each 50 μm width, which showed that avalanching is prevented.

Figure 19:
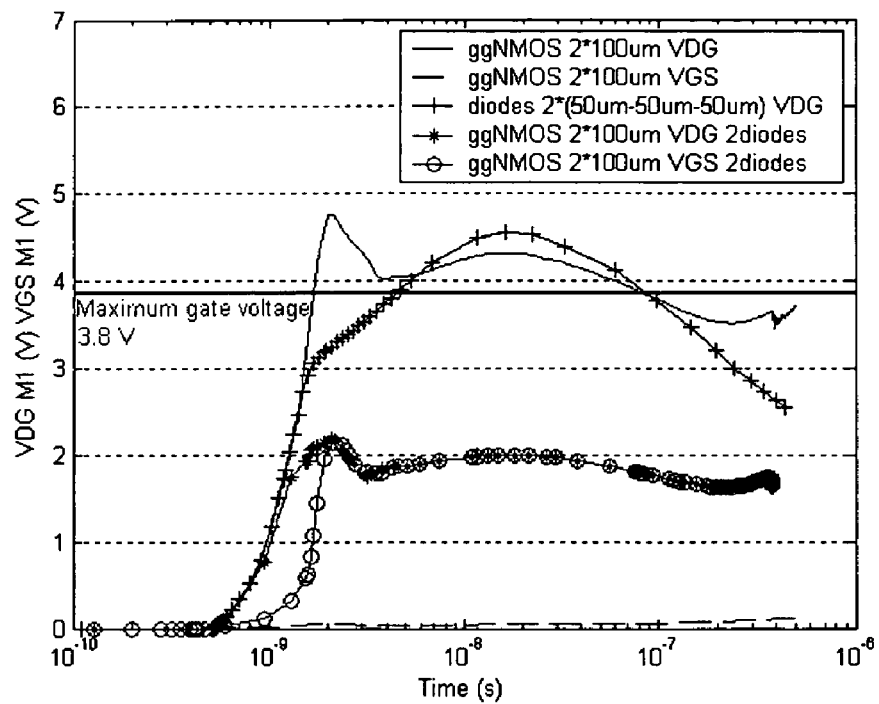
FIG. 19 shows a graph of the 2 kV HBM transient simulation between Vdd and ground. The drain to gate voltage of transistor $M_1$ goes above the allowed 3.8 V if no additional diodes are used. With these diodes, the voltages remain clamped to about 2 V.

However, a more severe problem arises during this positive stress on Vdd: When transistor $M_2$ starts conducting as explained earlier, stress is seen across the gate oxide of transistor $M_1$ between its drain and gate terminal. All protection devices make this voltage rise higher than the allowed 3.8 V (FIG. 19). Therefore, additional circuitry is needed to protect $M_1$ during this type of ESD stress. As before, adding diodes can solve the problem.

During stress between $V_{DD}$ and ground, the gate of transistor $M_2$ opens the channel, causing a possible over-voltage between the drain and gate of transistor $M_1$, depending on the power clamp used. Therefore, for safety reasons, diodes $D_4$ and $D_5$ (see Box B in FIG. 1) are added in series between the drain and gate of $M_1$ to limit this voltage.

The same diodes as described in section V.1 were used, each having a capacitance of 11 fF, thus, the total added capacitance between drain and gate of $M_1$ is 5.5 fF. Since this value is very small, and because of the presence of the cascode transistor $M_2$, there is no significant Miller effect increasing the capacitive load at Vgate. RF simulation with the RF diode compact model did not show any change in RF performance of the LNA circuit.

A diode in reverse polarity is not needed because during negative stress on Vdd, the ggNMOS is conducting in forward diode mode, and no damaging voltages occur at $M_1$. These two diodes act as a voltage divider with the two extra gate diodes used earlier between Vgate and ground.

The voltage, which was previously seen between drain and gate, is now evenly distributed between drain-gate and gate-source, and all voltages remain within the reliability limits of the oxide. This concept is illustrated in FIG. 19, where the voltages across $M_1$ are compared with and without the use of the extra diodes for a 2 kV HBM stress. 5 kV HBM simulations show that with the extra diodes the voltage across the gate of $M_1$ is maximum 2.3 V.

Figure 20:
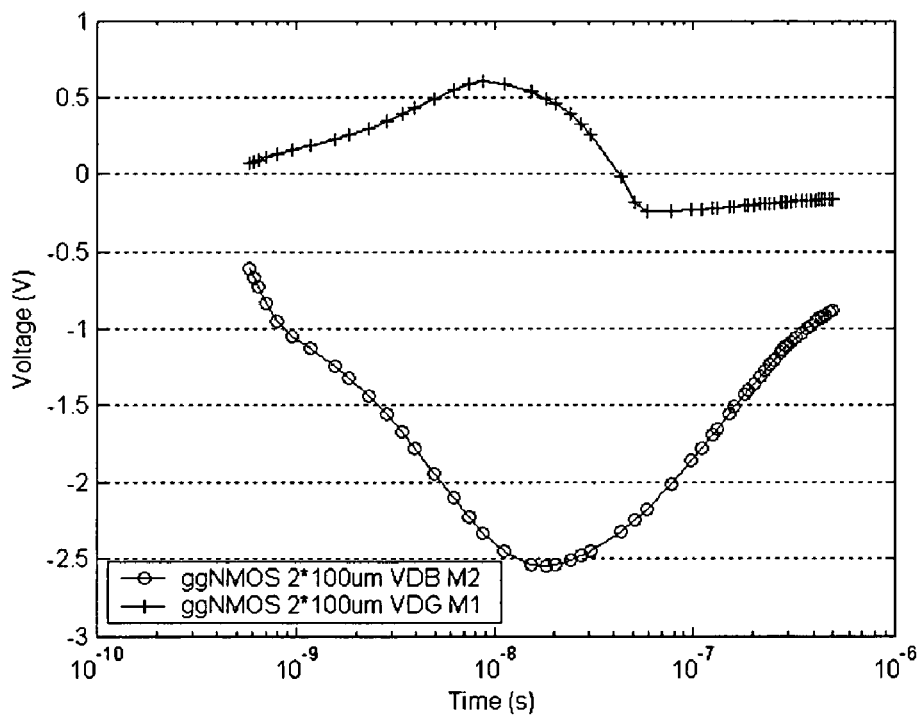
FIG. 20 shows a graph of the 2 kV HBM stress between ground and Vdd. This stress does not lead to any additional reliability issues. The positive voltage between drain and gate of $M_1$ is because of the diode in forward between ground and Vgate.

Negative stress between the Vdd and ground does not lead to any additional reliability issues, since the current is conducted by the bulk-drain diode in the ggNMOS, see FIG. 20.

VI. Results and effects on RF performance

All these added diodes do not have to conduct any ESD current except a few milliamps during a few nanoseconds to clamp the gate voltage on $M_1$. Hence, they can be sized very small, and placed without altering the original circuit. Diodes 1-3 result in an extra parasitic capacitance $C_D$ of 16 fF between the gate of $M_1$ and ground, diodes $D_{4-5}$ account for a capacitance $C'_D$ of 5.5 fF. Both introduced parasitic capacitances are small and do not deteriorate the input matching of the LNA. $C'_D$ is placed in parallel with the gate-drain overlap capacitance (64 fF for $M_1$ with a total gate width of 160 μm), and does not increase its Miller effect significantly. $C'_D$ can results in a lower impedance level at the gate of $M_1$, resulting in a lower gain of the LNA. At the same time, the LNAs noise factor, under input match condition, will only slightly increase with $$F_{ESD} \cong R_{s,D} R_s (\omega_o C_D)^2 \left(1 + \frac{\omega_o^2 L_G^2}{R_S^2}\right), \quad (3)$$

where $R_{s,D}$ is the equivalent series resistance of $C_D$. Equation (3) is much smaller then the contribution of dc limited Q of $L_{ESD}$, expressed in Equation (2). Further, the nonlinear distortion of the LNA is not deteriorated by the addition of the diodes. This is evidenced by the 1 dB compression point measurements, as discussed in the next section.

Figure 21:
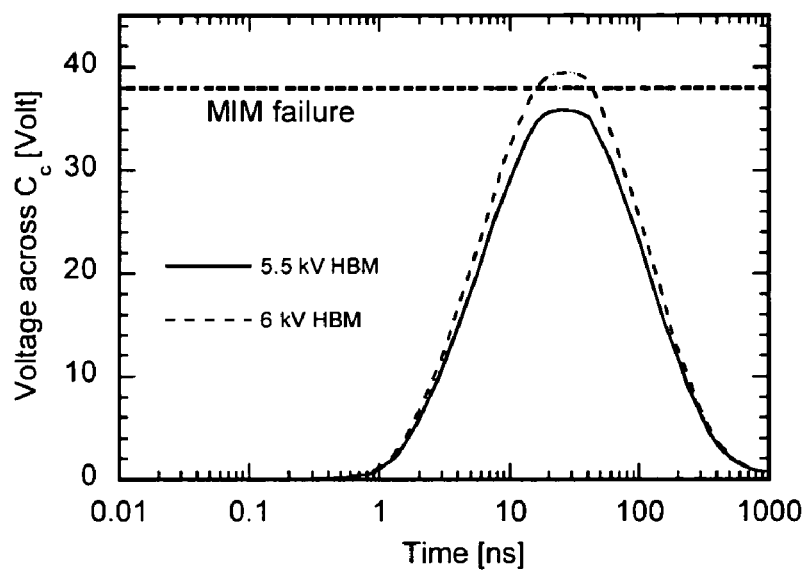
FIG. 21 shows a graph depicting the 5.5 and 6 kV HBM transient simulation, stressed input to ground. The voltage across the MIM capacitor CC is shown to be the failure mechanism of the proposed ESD protection strategy.

By applying this ESD protection strategy, the failure mechanism during an ESD event is moved away from the gate oxide. From FIG. 21, the voltage developed across the MIM capacitor $C_c$ during a 5.5 kV HBM simulation remains below the MIM failure level, which was measured with TLP to be at 38 V. A 6 kV HBM simulation, on the other hand, reveals a failure of the MIM capacitor.

Figure 22:
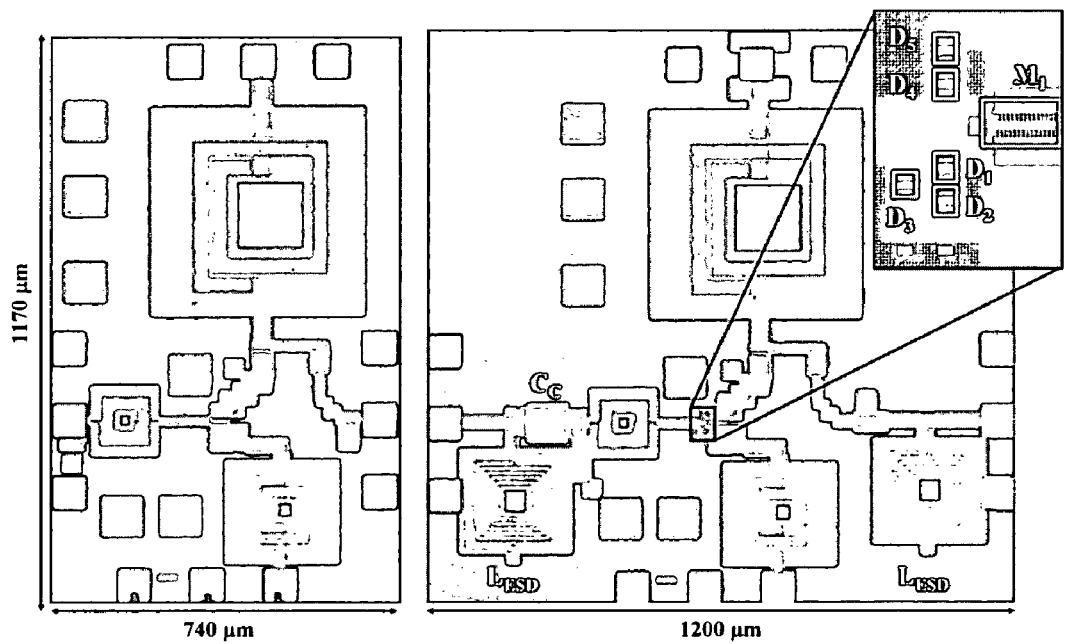
FIG. 22 shows a micrograph of the LNA without ESD protection (left), and with ESD protection (right), and a zoom on the clamping diodes (zoomed area is processed up to three metal levels).

In order to validate the presented ESD-protection solution, RF and ESD measurements results are performed for the reference LNA without ESD protection (LNA), the LNA with the inductor as ESD protection (ESD-LNA w/o diodes) and the LNA with both the inductor and the extra diodes as ESD protection (ESD-LNA with diodes). In FIG. 22, the layout of LNA is shown next to the ESD protected LNA, with a focus on the placement of the extra clamping diodes.

Figure 23:
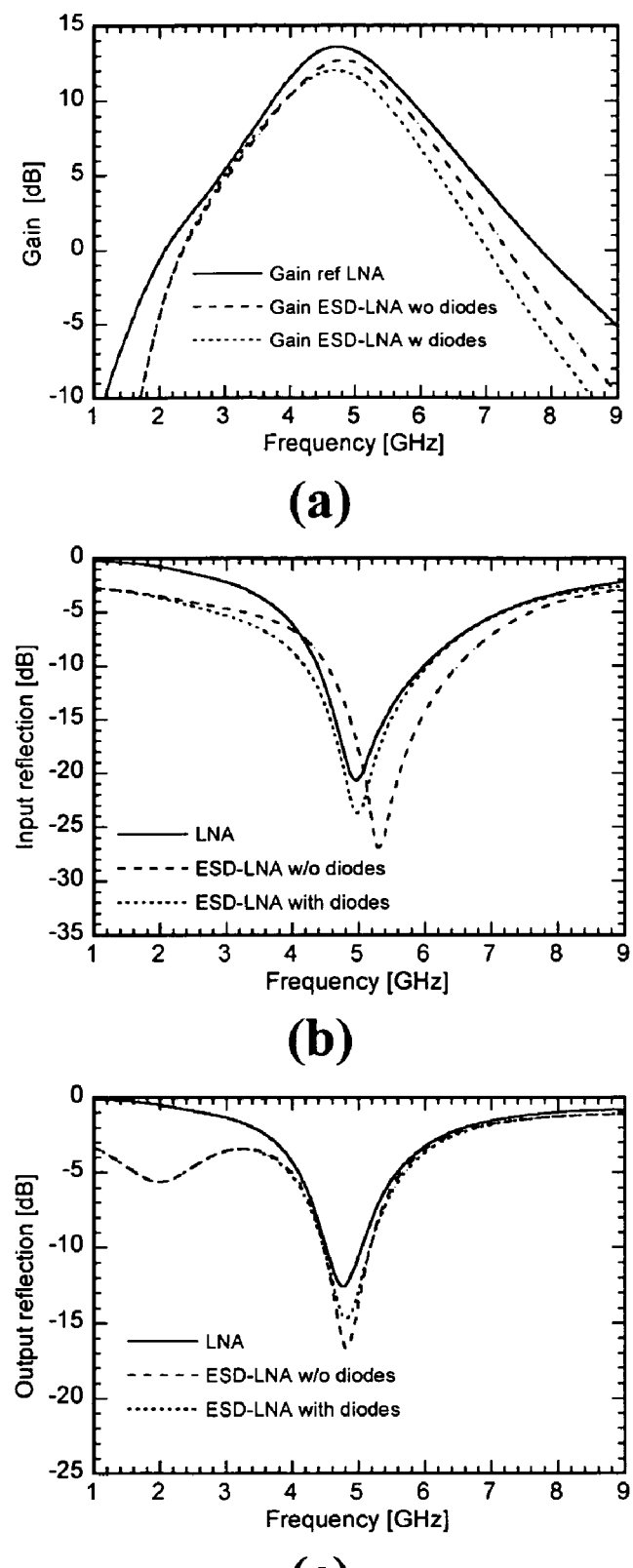
FIG. 23 shows a graph of measured gain (a), input reflection (b), and output reflection (c) of the reference LNA, ESD protected LNAs with and without clamping diodes.
Figure 24:
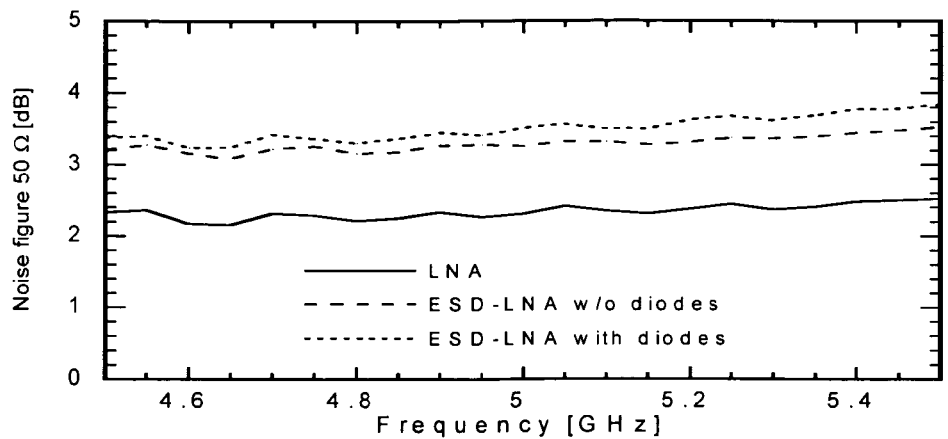
FIG. 24 shows a graph of the measured 50 Ω noise figure of the reference LNA, ESD protected LNAs with and without clamping diodes.

All measurements have been performed on-wafer. The LNAs are biased with a current of 7.5 mA flowing through the LNA from a $V_{DD}$ of 1.2 V. The LNA without ESD protection, the LNA with the inductor as ESD protection and the LNA with both the inductor and extra diodes as ESD protection have a power gain at 5 GHz, of 13.5 dB, 12.6 dB and 12 dB respectively, see FIG. 23*a*. Only a minor degradation is seen due to the ESD protection using the inductor only. Addition of the clamping devices reduces the gain with only 0.6 dB. As shown in FIG. 23*a*, the reverse gain for all LNAs remains below −30 dB. A good input and output matching (S11 and S22) is preserved when the reference LNA is protected by the inductor $L_{ESD}$, with and without the clamping diodes. Measurements of the input and output reflection coefficient are given in FIGS. 23*b* and 23*c*. By adding the inductor $L_{ESD}$, the noise figure increases from 2.2 dB to 3.2 dB at 5 GHz as expected from (2), see FIG. 24. Adding the clamping diodes results in a small NF increase of 0.2 dB. The major contribution to the noise factor stems from the integrated inductors LG and $L_{ESD}$, due to the limited Q-factor obtained at 5 GHz. The measurement results at 5 GHz of the three LNAs are summarized in Table 1.

The ESD performance of the inductor $L_{ESD}$ has been measured separately and showed that it could survive 5 A of TLP stress. The 400 μm ggNMOS (ground gate NMOS), used a power clamp also could withstand 5 A of TLP stress. Both TLP and HBM on-wafer measurements have been performed on the full circuit for different pin-to-pin combinations: input to ground, ground to input, input to $V_{DD}$, $V_{DD}$ to ground, output to ground and input to output.

After the ESD stress, a full RF characterization (S-parameter and Noise Figure (NF) measurement) has been performed to check whether any ESD-induced degradation had occurred in the circuit. The LNA without ESD protection fails at 50 V of HBM stress (which is the minimum equipment level), because of its unprotected sensitive gate oxide. The LNA with only the inductor as RF ESD protection has an ESD robustness of 2.2 A TLP, and 2.5 kV HBM at all pins. By adding the small extra clamping diodes, the ESD robustness of the circuit is dramatically improved yielding 4 A of TLP and 5.5 kV of HBM. When stressing from $V_{DD}$ to ground, the LNA only fails at 5 A TLP, which corresponds to the failure level of the ggNMOS at the $V_{DD}$ pin and to a higher protection level than the input. In this design, diodes $D_4$ and $D_5$ are not needed since the $V_{DD}$ pin is properly protected.

TABLE 1

RF performance summary at 5 GHz of the three different LNAs.

| At 5 GHz | LNA | ESD-LNA w/o diodes | ESD-LNA with diodes |
|---|---|---|---|
| VDD [Volt] | 1.2 | 1.2 | 1.2 |
| current [mA] | 7.5 | 7.5 | 7.5 |
| S11 [dB] | −21 | −18 | −24 |
| S22 [dB] | −11 | −14 | −14 |
| S21 [dB] | 13.5 | 12.6 | 12 |
| S12 [dB] | −31 | −32 | −32 |
| NF [dB] | 2.2 | 3.2 | 3.4 |
| 1 dB CP [dBm] | −11.5 | −10.5 | −9.6 |
| IIP3 [dBm] | −1 | −0.5 | 0.4 |
| TLP [A] | — | 2.2 | 4 |
| HBM [kV] | — | 2.5 | 5.5 |

SECOND EXAMPLE OF AN ESD-PROTECTED ANALOG CIRCUIT ACCORDING TO THE INVENTION: A DISTRIBUTED AMPLIFIER

Figure 25:
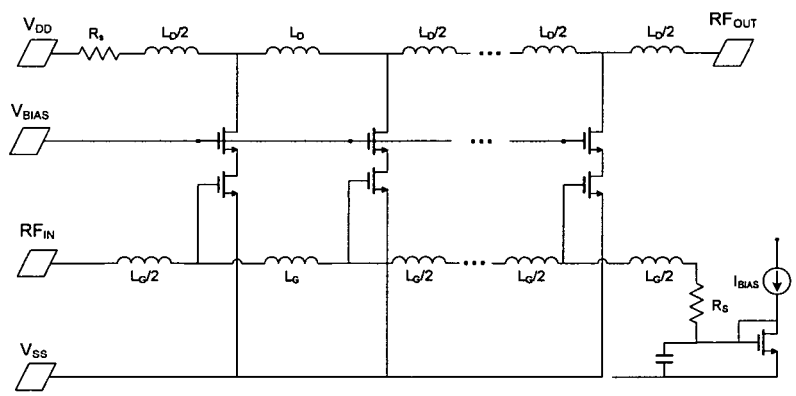
FIG. 25 shows another example of an analog circuit to be ESD-protected according to the invention, in particular a distributed amplifier, DA.

Distributed amplifiers (DAs) or travelling wave amplifiers (TWAs) employ a topology where the capacitance contributed by the gain stages are separated, but the output currents still combine together. Inductive elements are used to separate and compensate for the capacitances at the inputs and outputs of adjacent gain stages, as is shown in FIG. 25. An RF signal that is applied at the input end of the gate line travels down the line to the terminated end, where it is absorbed. As the signal travels down the gate line, each transistor is excited by the travelling voltage wave and transfers the signal to its entry on the drain line through its gain stage. If the phase velocities on the gate and drain lines are identical, then the signals on the drain line add in a perfect constructive interference in the forward direction as they arrive at the output. The waves travelling in the reverse direction are not in phase and, hence, tend to cancel, and any uncancelled signal is absorbed by the drain line termination.

The maximum gain bandwidth that can be reached in a given CMOS technology is given by:

$$A_o f_c \approx 0.8 f_{MAX}, \quad (4)$$

where $A_o$ is the DC gain, $f_c$ the bandwidth of the amplifiers, and $f_{MAX}$ is the maximum oscillation frequency of the used amplifying transistor. Today, a 80 GHz traveling wave amplifier has already been demonstrated in 90 nm CMOS. However, electrostatic discharge (ESD) protection is neither considered nor mentioned. It has been considered in a 10 GHz ESD-protected TWA realized in a 0.25 μm technology. More advanced technologies offer the possibility of higher bandwidth and a higher challenge in ESD protection.

In FIG. 25, the gate-inductors $L_G$ and the parasitic gate-capacitances $C_{gs}$ form the artificial gate line. Similarly, the drain inductors $L_D$ and the drain-capacitances $C_D$ construct the artificial drain line. The combination of the series inductive elements and the shunt capacitances forms a lumped artificial transmission line with a specific characteristic impedance:

$$Z_c = \sqrt{\frac{L}{C}} \quad (5)$$

in the case of a lossless transmission line. The value of the characteristic impedance can be adjusted according to the terminal impedance to achieve good matching over a very wide bandwidth (50 Ohm).

Figure 26:
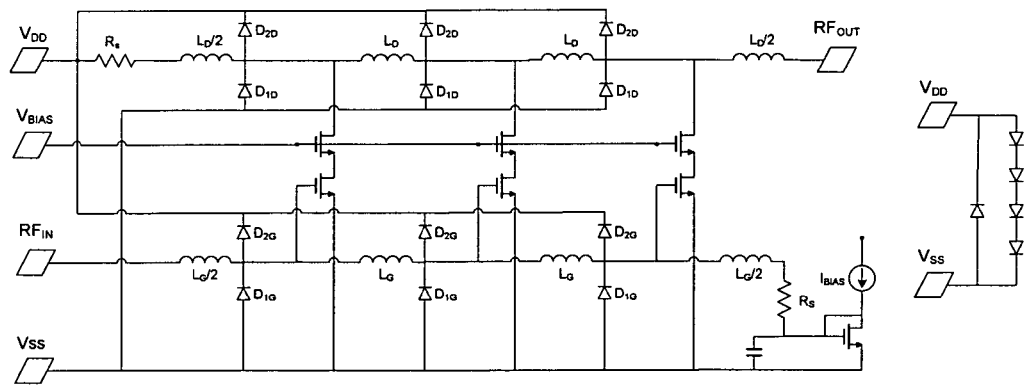
FIG. 26 shows the distributed amplifier with added circuit-level ESD protection.

However, the broad-band matching is infeasible with the traditional ESD protection scheme, which uses a pair of diodes connected to the input pad with a Vdd-to-Vss ESD clamp circuit. To achieve a comparable broad-band input match of the TWA after inserting the ESD protection circuit, the ESD protection components should be distributed in the TWA as well. The extra parasitic capacitance of each ESD protection component can then be included in each section of the artificial gate line. Hence, the value of the characteristic impedance in each section will be changed a little bit and the matching condition can still be approximately maintained over the band. According to the distributed ESD topology, a DA is co-designed with the ESD protection diode network, as shown in FIG. 26, diodes $D_{1G}$ and $D_{2G}$. The diodes, which are used as ESD protection devices, are distributed to each section of the TWA with substantially equal sizes to ensure that the design equations for the gain stages of the TWA can be used. The output RF pin is ESD protected in the same manner. The circuit can also be seen as a broadband ESD buffer.

One can also use a plug&play approach by adding ESD protection diodes as long as the overall amplifier specifications are met.

In the following, implementation issues for an ESD-protected sub-90 nm CMOS DA will be discussed.

A design in a sub-90 nm CMOS technology will result in both a higher maximum gain bandwidth of the amplifier according to Equation (4) Maintaining a given ESD protection level in such a technology is, however, more challenging. The oxide failure of the NMOS amplification transistors in the TWA will occur before the diodes reach their It2. A possible solution is to use an AC coupling capacitor between the ESD protection diodes and the gates of the different gain stages, as is shown in FIG. 27. Additionally, local gate oxide protection may be needed to protect the amplifiers against the voltage overshoot that occurs during the ESD stress events. Therefore, as shown in FIG. 27, diodes D1-D5 are added in the same way as described above with respect to the first example.

The capacitor $C_c$ can be selected such as to increase the bandwidth of the amplifier, since the effective capacitive loading on the gate line is reduced to:

$$Ce_{ff} = \left(\frac{C_c}{C_c + C_{gs}}\right) C_{gs} \quad (6)$$

The overall performance of the amplifier can be further optimized with an ESD-RF co-design approach.

Protecting a broadband amplifier against ESD events is a challenge. Some of the concepts developed for narrowband ESD protection can be reused. Distributed ESD protection offers the possibility of incorporating large ESD protecting devices in an artificial transmission line, enabling wideband high frequency ESD protection.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. A method for designing an electrostatic discharge (ESD) protected analog circuit, comprising:
    creating an original analog circuit design comprising a plurality of interconnected functional components and circuit-level ESD protection components with predetermined electric properties for achieving a predetermined analog performance during normal operation of the original circuit and a predetermined ESD robustness during an ESD event on the original circuit;
    simulating at least one ESD event on the original analog circuit design to identify at least one weak spot in the original circuit; and
    adding at least one component-level ESD protection component to a node between at least two functional components of the original analog circuit design to shunt ESD current around the at least one weak spot to reduce failure of the weak spot during an ESD event.

2. The method according to claim 1, wherein the component-level ESD protection components have substantially no influence on the analog performance during normal operation due to their size.

3. The method according to claim 1, further comprising evaluating the electric properties of the circuit-level ESD protection components.

4. The method of claim 3, further comprising adapting the circuit-level ESD protection components to reduce their impact on the analog performance during normal operation based on the evaluation.

5. The method according to claim 1, wherein the component-level ESD protection components comprise a diode network that is added to protect a functional element at the identified weak spot from an ESD event.

6. The method according to claim 5, wherein the diode network comprises diodes of contact size.

7. The method according to claim 1, wherein the circuit-level ESD protection components are plug&play ESD protection components and wherein creating an analog circuit design includes:
    creating the analog circuit design comprising the plurality of interconnected functional components and determining their electric properties for achieving the predetermined analog performance during normal operation of the circuit; and
    adding the plug&play ESD protection components onto the analog circuit design and determining their electric properties for achieving the predetermined ESD robustness during an ESD event on the circuit.

8. The method according to claim 1, wherein creating an analog circuit design includes co-designing the circuit-level ESD protection components with the functional components.

9. A method according to claim 1, wherein:
    the weak spot functional component is a transistor with a gate, a source, and a drain; and
    the component-level ESD protection includes a diode network between the gate and the drain.

10. A method according to claim 1, wherein the steps of simulating and adding are performed iteratively to identify successive weak spots and to add corresponding component-level ESD protection components.

11. An analog circuit, comprising in combination:
    a plurality of interconnected functional components with predetermined electric properties for achieving a predetermined analog performance during normal operation of the circuit;
    a plurality of circuit-level electrostatic discharge (ESD) protection components connected to the functional components with predetermined electric properties for achieving a predetermined ESD robustness during an ESD event on the circuit; and
    at least one component-level ESD protection component connected to a node between at least two of the functional components to shunt ESD current around a component that has been identified as a weak spot in the circuit to reduce failure of the weak spot during an ESD event.

12. The analog circuit according to claim 11, wherein the at least one component-level ESD protection component comprises a protective diode network that is adapted for protecting the at least one functional component identified as the weak spot during the ESD event.

13. The analog circuit according to claim 12, wherein the diode network comprises diodes of contact size.

14. The analog circuit according to claim 11, wherein the circuit is a low noise amplifier circuit for RF signals comprising:
- a first transistor having a source, a drain, a gate, and a gate oxide separating the gate from the source and the drain, wherein the first transistor forms one of the functional components of the circuit,
- first component-level ESD protection components connecting the gate to the drain and second component-level ESD protection components connecting the gate to ground, wherein the first and second ESD protection components are provided to avoid breakdown of the gate oxide during an ESD event.

15. The analog circuit according to claim 14, wherein the first and second ESD protection components comprise voltage clamping devices for clamping a voltage over the gate oxide during the ESD event at a predetermined maximum below a breakdown voltage of the gate oxide.

16. The analog circuit according to claim 15, wherein the first ESD protection components comprise an array of diodes arranged in series.

17. The analog circuit according to claim 16, wherein the diodes are of contact size.

18. The analog circuit according to claim 15, wherein the second ESD protection components comprise an array of diodes arranged in parallel and in opposite directions.

19. The analog circuit according to claim 18, wherein the diodes are of contact size.

20. The analog circuit according to claim 14, further comprising third and fourth ESD protection components that form low-impedance paths towards ground at frequencies below that of RF signals for which the low noise amplifier is designed.

21. The analog circuit according to claim 20, wherein the third and fourth ESD protection components comprise inductors at an input and an output of the circuit.

22. The analog circuit according to claim 11, wherein the circuit is a distributed amplifier comprising:
- a plurality of parallel gain stages, each comprising at least one transistor as one of the functional components, each transistor having a source, a drain, a gate, and a gate oxide separating the gate from the source and the drain,
- a network of the circuit-level ESD protection components distributed over the gain stages for shunting ESD currents upon occurrence of ESD events to ground, and
- first and second component-level ESD protection components associated with each of the gain stages, the first component-level ESD protection components connecting the gate to the drain and the second component-level ESD protection components connecting the gate to ground, wherein the first and second ESD protection components are provided to avoid breakdown of the gate oxide during an ESD event.

23. The analog circuit according to claim 22, wherein the first and second ESD protection components comprise voltage clamping devices for clamping a voltage over the gate oxide during the ESD event at a predetermined maximum below a breakdown voltage of the gate oxide.

24. The analog circuit according to claim 23, wherein the first ESD protection components comprise an array of diodes arranged in series.

25. The analog circuit according to claim 24, wherein the diodes are of contact size.

26. The analog circuit according to claim 23, wherein the second ESD protection components comprise an array of diodes arranged in parallel and in opposite directions.

27. The analog circuit according to claim 26, wherein the diodes are of contact size.

28. An analog circuit according to claim 11, wherein:
- the weak spot functional component is a transistor with a gate, a source, and a drain; and
- the component-level ESD protection includes a diode network between the gate and the drain.

* * * * *